(12) United States Patent
Kikuchi et al.

(10) Patent No.: US 11,790,867 B2
(45) Date of Patent: *Oct. 17, 2023

(54) ACTIVE MATRIX SUBSTRATE, LIQUID CRYSTAL DISPLAY DEVICE, AND ORGANIC EL DISPLAY DEVICE

(71) Applicant: Sharp Kabushiki Kaisha, Sakai (JP)

(72) Inventors: Tetsuo Kikuchi, Sakai (JP); Hideki Kitagawa, Sakai (JP); Hajime Imai, Sakai (JP); Toshikatsu Itoh, Sakai (JP); Masahiko Suzuki, Sakai (JP); Teruyuki Ueda, Sakai (JP); Kengo Hara, Sakai (JP); Setsuji Nishimiya, Sakai (JP); Tohru Daitoh, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/076,433

(22) Filed: Dec. 7, 2022

(65) Prior Publication Data

US 2023/0100273 A1 Mar. 30, 2023

Related U.S. Application Data

(63) Continuation of application No. 17/724,781, filed on Apr. 20, 2022, now Pat. No. 11,551,629, which is a
(Continued)

(30) Foreign Application Priority Data

Mar. 27, 2017 (JP) .................. 2017-060482

(51) Int. Cl.
*G09G 3/36* (2006.01)
*G02F 1/1362* (2006.01)
(Continued)

(52) U.S. Cl.
CPC ..... *G09G 3/3648* (2013.01); *G02F 1/136213* (2013.01); *H10K 59/00* (2023.02); *H10K 59/123* (2023.02); *H01L 27/1214* (2013.01)

(58) Field of Classification Search
CPC .......... G09G 3/3648; G02F 1/136213; G02F 1/134372; G02F 1/13685; G02F 2202/104;
(Continued)

(56) References Cited

U.S. PATENT DOCUMENTS

2015/0060896 A1* 3/2015 Okano ................ G09G 3/3225
257/88
2016/0247831 A1* 8/2016 Makita ................ H01L 27/1237

FOREIGN PATENT DOCUMENTS

JP 2010003910 A * 1/2010

OTHER PUBLICATIONS

Kikuchi et al., "Active Matrix Substrate, Liquid Crystal Display Device, and Organic EL Display Device", U.S. Appl. No. 17/724,781, filed Apr. 20, 2022.

* cited by examiner

*Primary Examiner* — Abhishek Sarma
(74) *Attorney, Agent, or Firm* — KEATING & BENNETT, LLP

(57) ABSTRACT

According to an embodiment of the present invention, an active matrix substrate (100) includes a display region (DR) defined by a plurality of pixel regions (P) arranged in a matrix and a peripheral region (FR) located around the display region. The active matrix substrate includes a substrate (1), a first TFT (10), and a second TFT (20). The first TFT is supported by the substrate and disposed in the peripheral region. The second TFT is supported by the substrate and disposed in the display region. The first TFT includes a crystalline silicon semiconductor layer (11),
(Continued)

which is an active layer. The second TFT includes an oxide semiconductor layer (21), which is an active layer. The first TFT and the second TFT each have a top-gate structure.

23 Claims, 20 Drawing Sheets

Related U.S. Application Data continuation of application No. 17/401,396, filed on Aug. 13, 2021, now Pat. No. 11,322,105, which is a continuation of application No. 16/495,463, filed as application No. PCT/JP2018/010524 on Mar. 16, 2018, now Pat. No. 11,107,429.

(51) Int. Cl.
*H10K 59/00* (2023.01)
*H10K 59/123* (2023.01)
*H01L 27/12* (2006.01)

(58) Field of Classification Search
CPC ............... G02F 1/13454; G02F 1/1368; H01L 27/3225; H01L 27/3248; H01L 27/1214; H01L 27/1248; H01L 29/78633; H01L 27/1225; H01L 27/1251; H01L 51/50; G09F 9/30; H05B 33/02
See application file for complete search history.

ACTIVE MATRIX SUBSTRATE, LIQUID CRYSTAL DISPLAY DEVICE, AND ORGANIC EL DISPLAY DEVICE

TECHNICAL FIELD

The present invention relates to an active matrix substrate and, in particular, relates to an active matrix substrate including both oxide semiconductor TFTs and crystalline silicon TFTs. In addition, the present invention relates to a liquid crystal display device and an organic EL display device each including such an active matrix substrate.

BACKGROUND ART

In an active matrix substrate, which is used for a liquid crystal display device and the like, a switching element is provided for each of the pixels. An example of the switching element is a thin film transistor (hereinafter, a "TFT"). As the switching element, a TFT in which an amorphous silicon film is used as an active layer (hereinafter, an "amorphous silicon TFT") and a TFT in which a polycrystalline silicon film is used as an active layer (hereinafter, a "polycrystalline silicon TFT") are widely used.

In recent years, it has been proposed to use an oxide semiconductor as a material for an active layer of a TFT, in place of amorphous silicon and polycrystalline silicon. A TFT in which an oxide semiconductor film is included as an active layer is referred to as an "oxide semiconductor TFT". PTL 1 discloses an active matrix substrate in which an In—Ga—Zn—O system semiconductor film is used as an active layer of a TFT.

Oxide semiconductors have a higher mobility than amorphous silicon. Thus, oxide semiconductor TFTs can operate at a higher speed than amorphous silicon TFTs. Furthermore, oxide semiconductor films are formed using a simpler process than that for polycrystalline silicon films and therefore can be employed for devices that require a large area.

An active matrix substrate typically includes a display region and a peripheral region. The display region includes a plurality of pixels (pixel regions) arranged in a matrix and is also referred to as an active region. The peripheral region is located around the display region and is also referred to as a frame region.

In the display region, TFTs formed for respective pixels are provided, and gate bus lines, source bus lines, and pixel electrodes that are respectively electrically connected to the gate electrodes, source electrodes, and drain electrodes of the TFTs are provided.

In the peripheral region, drive circuits for driving the gate bus lines (scanning lines) and the source bus lines (signal lines) are disposed. Specifically, a gate driver for providing gate signals (scan signals) to the gate bus lines and a source driver for providing source signals (display signals) to the source bus lines are disposed. Drive circuits, such as the gate driver and the source driver, may be mounted as semiconductor chips (by COG (Chip On Glass) mounting) or may be formed monolithically (integrally) with the active matrix substrate. A drive circuit formed monolithically is referred to as a "driver monolithic circuit". A driver monolithic circuit typically includes a TFT.

In this specification, a TFT disposed as a switching element for each of the pixels in the display region is referred to as a "pixel TFT", and a TFT included in a peripheral circuit, such as a drive circuit, is referred to as a "circuit TFT". For active matrix substrates in which oxide semiconductor TFTs are used as the pixel TFTs, it is preferable, from the standpoint of the manufacturing process, that circuit TFTs be oxide semiconductor TFTs formed from the same oxide semiconductor film from which the pixel TFTs are formed.

However, although the mobility of oxide semiconductors is higher than the mobility of amorphous silicon as described above, the mobility of oxide semiconductors is approximately one order of magnitude lower than the mobility of polycrystalline silicon. As such, oxide semiconductor TFTs have a lower current driving ability than polycrystalline silicon TFTs. Thus, there is a possibility that a driver monolithic circuit configured with an oxide semiconductor TFT may have an insufficient driving ability. If the size of the TFT is increased (the channel width is increased) to compensate for the low current driving ability, narrowing of the peripheral region is hindered.

PTL 2 discloses a configuration in which oxide semiconductor TFTs are used as pixel TFTs and in which polycrystalline silicon TFTs are included as circuit TFTs in peripheral circuits. In the configuration disclosed in PTL 2, the oxide semiconductor TFTs have a bottom-gate structure, and the polycrystalline silicon TFTs have a top-gate structure.

CITATION LIST

Patent Literature

PTL 1: Japanese Unexamined Patent Application Publication No. 2012-134475

PTL 2: Japanese Unexamined Patent Application Publication No. 2010-3910

SUMMARY OF INVENTION

Technical Problem

The configuration of PTL 1, however, poses problems such as those described below.

First, in oxide semiconductor TFTs having a bottom-gate structure, the gate insulating layer is relatively thick because a voltage breakdown resistance between the source and the gate needs to be ensured, and therefore the current driving ability is reduced. An on-state current Ion of a TFT is expressed by equation (1) below.

$$Ion=(1/2)\cdot(W/L)\cdot Cox\cdot(Vg-Vth)^2 \qquad (1)$$

In equation (1), W is the channel width, L is the channel length, Vg is the gate voltage, and Vth is the threshold voltage. Furthermore, Cox is expressed by equation (2) below. In equation (2), $\varepsilon_0$ is the dielectric constant of vacuum, $\varepsilon r$ is the relative dielectric constant of the gate insulating layer, and d is the thickness of the gate insulating layer.

$$Cox=\varepsilon_0\cdot\varepsilon r/d \qquad (2)$$

As can be seen from equations (1) and (2), as the thickness d of the gate insulating layer increases, the on-state current Ion decreases.

Note that, as can be seen from equation (1), the on-state current Ion can be increased by increasing the gate voltage Vg (i.e., increasing a high-level potential Vgh of the gate signal). However, polycrystalline silicon TFTs included in peripheral circuits have a low voltage breakdown resistance, and therefore, when a high high-level potential Vgh is supplied as the gate voltage Vg, there is a possibility that the leakage current may increase and reliability may decrease.

Furthermore, in oxide semiconductor TFTs having a bottom-gate structure, a gate-drain capacitance Cgd is relatively large because, in consideration of alignment accuracy and the like, the TFTs are typically designed such that the gate electrode overlaps the source electrode and the drain electrode as viewed in a direction normal to the substrate. As such, variations in the gate-drain capacitance Cgd due to variations in the area of overlap of the gate electrode and the drain electrode and in the thickness of the gate insulating layer are large. The gate-drain capacitance Cgd significantly affects a kickback voltage Vkb (also referred to as a "feed-through voltage"). The kickback voltage Vkb is expressed by equation (3) below. In equation (3), C_total is the capacitance value of the total of the liquid crystal capacitance, the auxiliary capacitance, and the parasitic capacitances, such as the gate-drain capacitance Cgd, and ΔVg is the difference between the high-level potential Vgh of the gate signal and a low-level potential Vgl thereof.

$$Vkb=(Cgd/C\_{\text{total}})\cdot \Delta Vg \qquad (3)$$

As can be seen from equation (3), as variations in the gate-drain capacitance Cgd increase, variations in the kickback voltage Vkb also increase, and as a result, variations in the optimal counter voltage in a plane of the panel increase (i.e., the in-plane flicker distribution increases), which results in a degradation of display quality.

As described above, no optimal structure has been found for cases in which oxide semiconductor TFTs are used as pixel TFTs, and crystalline silicon TFTs are used as circuit TFTs.

The present invention has been made in view of the foregoing problems, and an object of the present invention is to realize a structure suitable for an active matrix substrate that is provided with both oxide semiconductor TFTs and crystalline silicon TFTs.

Solution to Problem

According to an embodiment of the present invention, an active matrix substrate includes a display region and a peripheral region. The display region is defined by a plurality of pixel regions arranged in a matrix. The peripheral region is located around the display region. The active matrix substrate includes a substrate, a first TFT, and a second TFT. The first TFT is supported by the substrate and disposed in the peripheral region. The second TFT is supported by the substrate and disposed in the display region. The first TFT includes a crystalline silicon semiconductor layer. The crystalline silicon semiconductor layer is an active layer. The second TFT includes an oxide semiconductor layer. The oxide semiconductor layer is an active layer. The first TFT and the second TFT each have a top-gate structure.

One embodiment is as follows. The first TFT includes the crystalline silicon semiconductor layer, a first gate insulating layer, a first gate electrode, a first source electrode, and a first drain electrode. The first gate insulating layer is provided on the crystalline silicon semiconductor layer. The first gate electrode is provided on the first gate insulating layer and faces the crystalline silicon semiconductor layer with the first gate insulating layer disposed therebetween. The first source electrode and the first drain electrode are each electrically connected to the crystalline silicon semiconductor layer. The second TFT includes the oxide semiconductor layer, a second gate insulating layer, a second gate electrode, a second source electrode, and a second drain electrode. The second gate insulating layer is provided on the oxide semiconductor layer. The second gate electrode is provided on the second gate insulating layer and faces the oxide semiconductor layer with the second gate insulating layer disposed therebetween. The second source electrode and the second drain electrode are each electrically connected to the oxide semiconductor layer.

Another embodiment is as follows. The active matrix substrate includes a first insulating layer and a second insulating layer. The first insulating layer includes the first gate insulating layer. The second insulating layer is provided on the first insulating layer and includes a portion that covers the first gate electrode. The oxide semiconductor layer is provided on the second insulating layer. The active matrix substrate further includes a third insulating layer provided on the second insulating layer. The third insulating layer includes a portion that covers the oxide semiconductor layer, the second gate insulating layer, and the second gate electrode.

Another embodiment is as follows. The second insulating layer is a single layer, in which no multilayer structure is present.

Another embodiment is as follows. The first source electrode, the first drain electrode, the second source electrode, and the second drain electrode are provided on the third insulating layer. The first source electrode and the first drain electrode are connected to the crystalline silicon semiconductor layer, respectively via a first contact hole and a second contact hole each formed in the first insulating layer, the second insulating layer, and the third insulating layer. The second source electrode and the second drain electrode are connected to the oxide semiconductor layer, respectively via a third contact hole and a fourth contact hole each formed in the third insulating layer.

Another embodiment is as follows. The active matrix substrate includes a first insulating layer including the first gate insulating layer. The oxide semiconductor layer is provided on the first insulating layer. The active matrix substrate further includes a second insulating layer provided on the first insulating layer. The second insulating layer includes a portion that covers the first gate electrode, the oxide semiconductor layer, the second gate insulating layer, and the second gate electrode.

Another embodiment is as follows. The first source electrode, the first drain electrode, the second source electrode, and the second drain electrode are provided on the second insulating layer. The first source electrode and the first drain electrode are connected to the crystalline silicon semiconductor layer, respectively via a first contact hole and a second contact hole each formed in the first insulating layer and the second insulating layer. The second source electrode and the second drain electrode are connected to the oxide semiconductor layer, respectively via a third contact hole and a fourth contact hole each formed in the second insulating layer.

Another embodiment is as follows. The first gate insulating layer and the second gate insulating layer are layers formed from an identical insulating film. The first gate electrode and the second gate electrode are electrodes formed from an identical electrically conductive film.

Another embodiment is as follows. The active matrix substrate includes a first insulating layer. The first insulating layer includes a portion that covers the first gate insulating layer and the first gate electrode and a portion that covers the second gate insulating layer and the second gate electrode. The first source electrode, the first drain electrode, the second source electrode, and the second drain electrode are provided on the first insulating layer. The first source electrode and the first drain electrode are connected to the crystalline silicon semiconductor layer, respectively via a first contact hole and a second contact hole each formed in the first gate insulating layer and the first insulating layer. The second source electrode and the second drain electrode are connected to the oxide semiconductor layer, respectively via a third contact hole and a fourth contact hole each formed in the first insulating layer.

Another embodiment is as follows. The active matrix substrate further includes a first light blocking layer and a second light blocking layer. The first light blocking layer is provided below the crystalline silicon semiconductor layer and overlaps the crystalline silicon semiconductor layer as viewed in a direction normal to a surface of the substrate. The second light blocking layer is provided below the oxide semiconductor layer and overlaps the oxide semiconductor layer as viewed in the direction normal to the surface of the substrate.

Another embodiment is as follows. The second light blocking layer is formed of an electrically conductive material and is electrically connected to the second gate electrode.

Another embodiment is as follows. The second drain electrode does not overlap the second gate electrode as viewed in a direction normal to a surface of the substrate.

Another embodiment is as follows. The active matrix substrate includes a peripheral circuit provided in the peripheral region. The first TFT is included in the peripheral circuit. The second TFT is disposed in each of the plurality of pixel regions.

Another embodiment is as follows. Each of the plurality of pixel regions includes the second TFT and a third TFT. The third TFT includes a crystalline silicon semiconductor layer. The crystalline silicon semiconductor layer is an active layer. The crystalline silicon semiconductor layer is a layer formed from an identical semiconductor film from which the crystalline silicon semiconductor layer of the first TFT is formed. The third TFT has a top-gate structure.

Another embodiment is as follows. A portion of the crystalline silicon semiconductor layer of the third TFT is connected to a portion of the oxide semiconductor layer of the second TFT.

Another embodiment is as follows. The oxide semiconductor layer includes an In—Ga—Zn—O system semiconductor.

Another embodiment is as follows. The In—Ga—Zn—O system semiconductor includes a crystalline portion.

According to an embodiment of the present invention, a liquid crystal display device includes the active matrix substrate.

According to an embodiment of the present invention, an organic EL display device includes the active matrix substrate.

Advantageous Effects of Invention

Embodiments of the present invention realize structures suitable for active matrix substrates that are provided with both oxide semiconductor TFTs and crystalline silicon TFTs.

DESCRIPTION OF EMBODIMENTS

Embodiments of the present invention will now be described with reference to the drawings. Active matrix substrates of embodiments of the present invention can be widely used, for example, in a variety of display devices and electronic devices. Note that the present invention is not limited to the embodiments described below.

First Embodiment

Figure 1:
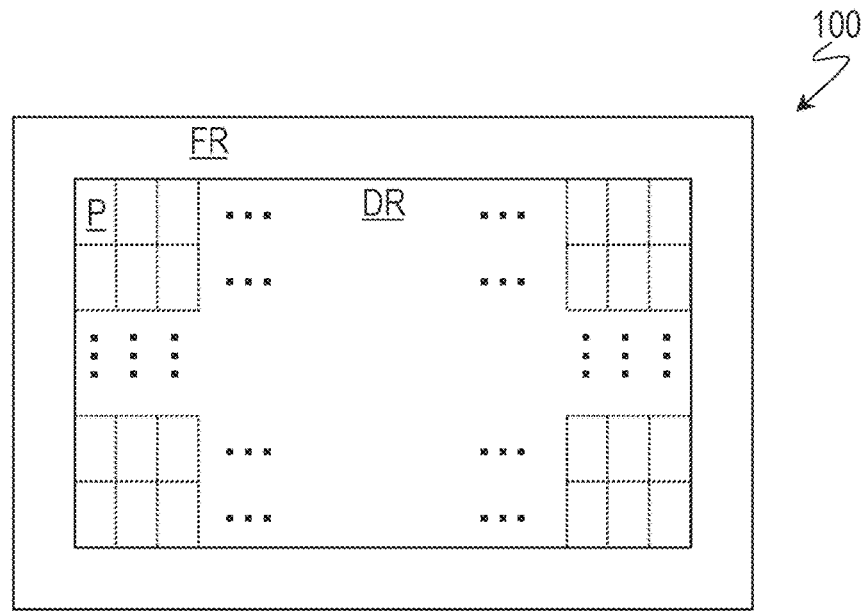
FIG. 1 is a schematic plan view of an active matrix substrate 100, according to an embodiment of the present invention.

An active matrix substrate 100, according to the present embodiment, will be described with reference to FIG. 1. FIG. 1 is a schematic plan view of the active matrix substrate 100.

As illustrated in FIG. 1, the active matrix substrate 100 includes a display region DR and a peripheral region FR.

The display region DR is defined by a plurality of pixel regions P. The plurality of pixel regions P are arranged in a matrix, which includes a plurality of rows and a plurality of columns. The display region DR may also be referred to as an "active region". The peripheral region FR is located around the display region DR. The peripheral region FR may also be referred to as a "frame region". Peripheral circuits (not illustrated) are provided in the peripheral region FR.

Figure 2:
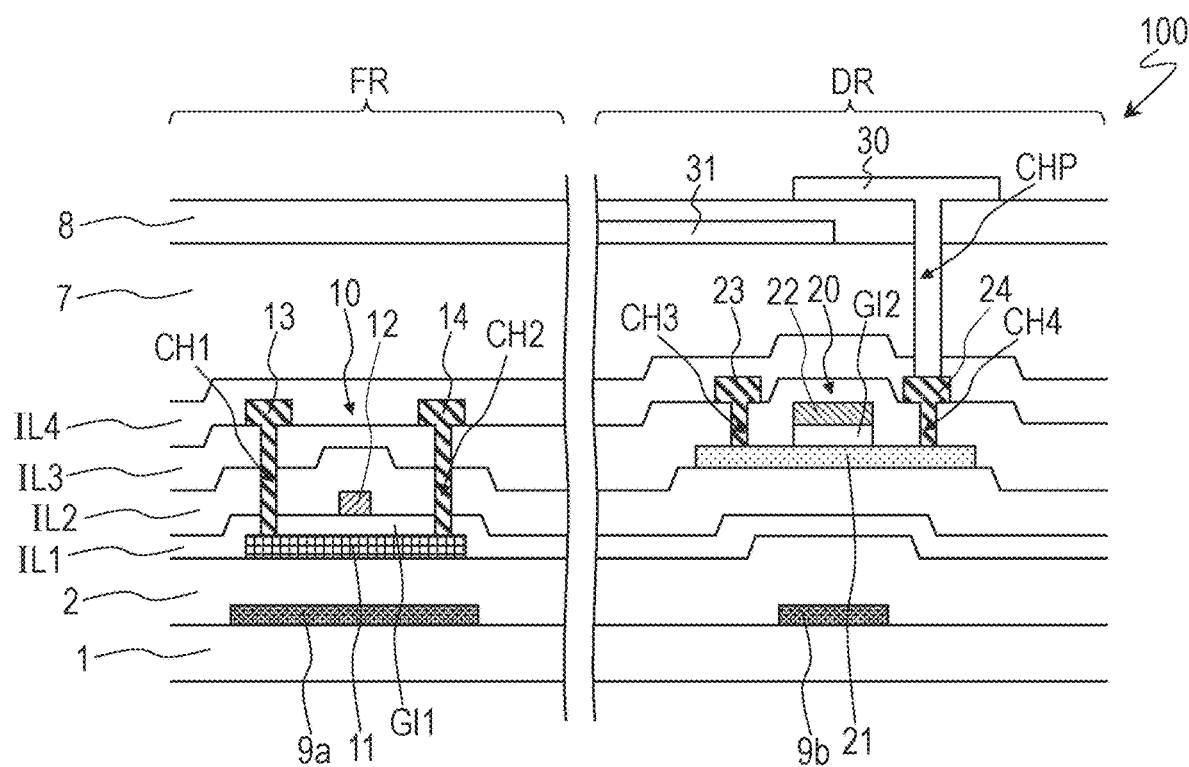
FIG. 2 is a schematic cross-sectional view of the active matrix substrate 100, with the left side illustrating a circuit TFT provided in a peripheral region FR and the right side illustrating a pixel TFT provided in a display region DR.
Figure 3:
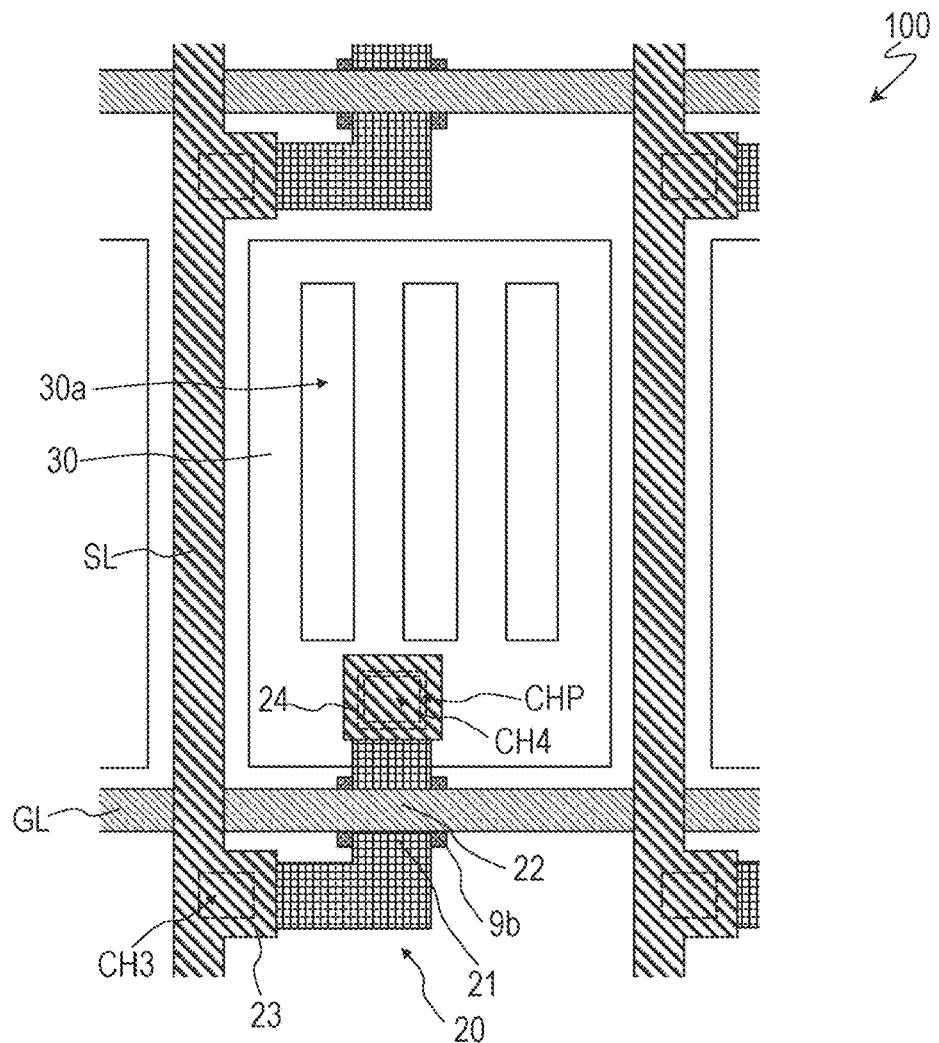
FIG. 3 is a schematic plan view of the active matrix substrate 100, which illustrates a pixel region P.

A more specific configuration of the active matrix substrate 100 will be described with reference also to FIG. 2 and FIG. 3. FIG. 2 is a schematic cross-sectional view, and FIG. 3 is a schematic plan view, both illustrating the active matrix substrate 100. In FIG. 2, the left side illustrates a circuit TFT provided in the peripheral region FR, and the right side illustrates a pixel TFT provided in the display region DR. FIG. 3 illustrates a pixel region P. FIG. 2 and FIG. 3 illustrate an example of an active matrix substrate 100 for use in FFS (Fringe Field Switching) mode liquid crystal display devices.

As illustrated in FIG. 2 and FIG. 3, the active matrix substrate 100 includes a substrate 1, a first TFT 10, and second TFT 20. The first TFT 10 and the second TFT 20 are supported by the substrate 1. The first TFT 10 is disposed in the peripheral region FR. The second TFT 20 is disposed in the display region DR.

The first TFT 10 includes a crystalline silicon semiconductor layer 11, which is an active layer. That is, the first TFT 10 is a crystalline silicon TFT. Furthermore, the first TFT 10 is a circuit TFT included in a peripheral circuit. The first TFT 10 includes a first gate insulating layer GI1, a first gate electrode 12, a first source electrode 13, and a first drain electrode 14, in addition to the above-mentioned crystalline silicon semiconductor layer 11.

In the present embodiment, the crystalline silicon semiconductor layer 11 is a polycrystalline silicon layer (e.g., a low-temperature poly-silicon (LTPS) layer). In the illustrated example, a base coat layer (underlayer) 2 is provided on the substrate 1, and the crystalline silicon semiconductor layer 11 is provided on the base coat layer 2.

The first gate insulating layer GI1 is provided on the crystalline silicon semiconductor layer 11. In the present embodiment, a first insulating layer IL1, which includes the first gate insulating layer GI1, is formed on the base coat layer 2 and the crystalline silicon semiconductor layer 11, and a portion of the first insulating layer IL1 (a portion that covers the crystalline silicon semiconductor layer 11) serves as the first gate insulating layer GI1.

The first gate electrode 12 is provided on the first gate insulating layer GI1. The first gate electrode 12 faces the crystalline silicon semiconductor layer 11 with the first gate insulating layer GI1 disposed therebetween.

The first source electrode 13 and the first drain electrode 14 are electrically connected to the crystalline silicon semiconductor layer 11. In the present embodiment, a second insulating layer (insulating interlayer) IL2, which includes a portion that covers the first gate electrode 12, is provided on the first insulating layer IL1. The second insulating layer IL2 is a single layer, in which no multilayer structure is present. Furthermore, a third insulating layer (protective layer) IL3 is provided on the second insulating layer IL2. The first source electrode 13 and the first drain electrode 14 are provided on the third insulating layer IL3. The first source electrode 13 and the first drain electrode 14 are connected to the crystalline silicon semiconductor layer 11, respectively via a first contact hole CH1 and a second contact hole CH2, which are formed in the first insulating layer IL1 (first gate insulating layer GI1), the second insulating layer IL2, and the third insulating layer IL3.

The second TFT 20 includes an oxide semiconductor layer 21, which is an active layer. That is, the second TFT 20 is an oxide semiconductor TFT. Furthermore, the second TFT 20 is a pixel TFT disposed in each of the plurality of pixel regions P. The second TFT 20 includes a second gate insulating layer GI2, a second gate electrode 22, a second source electrode 23, and a second drain electrode 24, in addition to the above-mentioned oxide semiconductor layer 21.

The oxide semiconductor layer 21 includes an In—Ga—Zn—O system semiconductor, for example. The oxide semiconductor layer 21 is provided on the second insulating layer IL2.

The second gate insulating layer GI2 is provided on the oxide semiconductor layer 21. The second gate insulating layer GI2 is formed only on a region that overlaps the second gate electrode 22 and is in the form of an island.

The second gate electrode 22 is provided on the second gate insulating layer GI2. The second gate electrode 22 faces the oxide semiconductor layer 21 with the second gate insulating layer GI2 disposed therebetween.

The second source electrode 23 and the second drain electrode 24 are electrically connected to the oxide semiconductor layer 21. The third insulating layer IL3 includes a portion that covers the oxide semiconductor layer 21, the second gate insulating layer GI2, and the second gate electrode 22. The second source electrode 23 and the second drain electrode 24 are provided on the third insulating layer IL3. The second source electrode 23 and the second drain electrode 24 are connected to the oxide semiconductor layer 21, respectively via a third contact hole CH3 and a fourth contact hole CH4, which are formed in the third insulating layer IL3. The second gate electrode 22 does not overlap the second source electrode 23 or the second drain electrode 24 as viewed in a direction normal to a surface of the substrate.

A fourth insulating layer (protective layer) IL4 is provided on the third insulating layer IL3 to cover the first source electrode 13, the first drain electrode 14, the second source electrode 23, and the second drain electrode 24.

As described above, the first TFT 10 and the second TFT 20 each have a top-gate structure.

Furthermore, the active matrix substrate 100 includes gate bus lines (scan lines) GL, source bus lines (signal lines) SL, pixel electrodes 30, and a common electrode 31.

The gate bus line GL extends in a row direction and is electrically connected to the second gate electrode 22 of the second TFT 20. In the illustrated example, a portion of the gate bus line GL, which is a portion that overlaps the oxide semiconductor layer 21, serves as the second gate electrode 22.

The source bus line SL extends in a column direction and is electrically connected to the second source electrode 23 of the second TFT 20. In the illustrated example, the second source electrode 23 is provided as an extended portion of the source bus line SL.

The common electrode 31 is provided as a common electrode for the plurality of pixel regions P and is given a potential that is common for the entire display region DR. In the present embodiment, a planarization layer 7 is provided on the fourth insulating layer IL4, and the common electrode 31 is provided on planarization layer 7. The planarization layer 7 is formed of an organic insulating material (e.g., a photosensitive resin material).

The pixel electrode 30 is provided for each of the plurality of pixel regions P and is electrically connected to the second drain electrode 24 of the second TFT 20. In the present embodiment, a dielectric layer 8 is provided to cover the common electrode 31, and the pixel electrode 30 is provided on the dielectric layer 8. The pixel electrode 30 is connected to the second drain electrode 24 via a pixel contact hole CHP, which is formed in the fourth insulating layer IL4, the planarization layer 7, and the dielectric layer 8. The pixel electrode 30 includes at least one slit 30a (in the example illustrated in FIG. 3, three slits 30a).

The active matrix substrate 100 further includes a first light blocking layer 9a and a second light blocking layer 9b. The first light blocking layer 9a is provided below the crystalline silicon semiconductor layer 11. The first light blocking layer 9a overlaps the crystalline silicon semiconductor layer 11 as viewed in a direction normal to the surface of the substrate. The second light blocking layer 9b is provided below the oxide semiconductor layer 21. The second light blocking layer 9b overlaps the oxide semiconductor layer 21 as viewed in a direction normal to the surface of the substrate. The first light blocking layer 9a and the second light blocking layer 9b are covered by the base coat layer 2.

Figure 4:
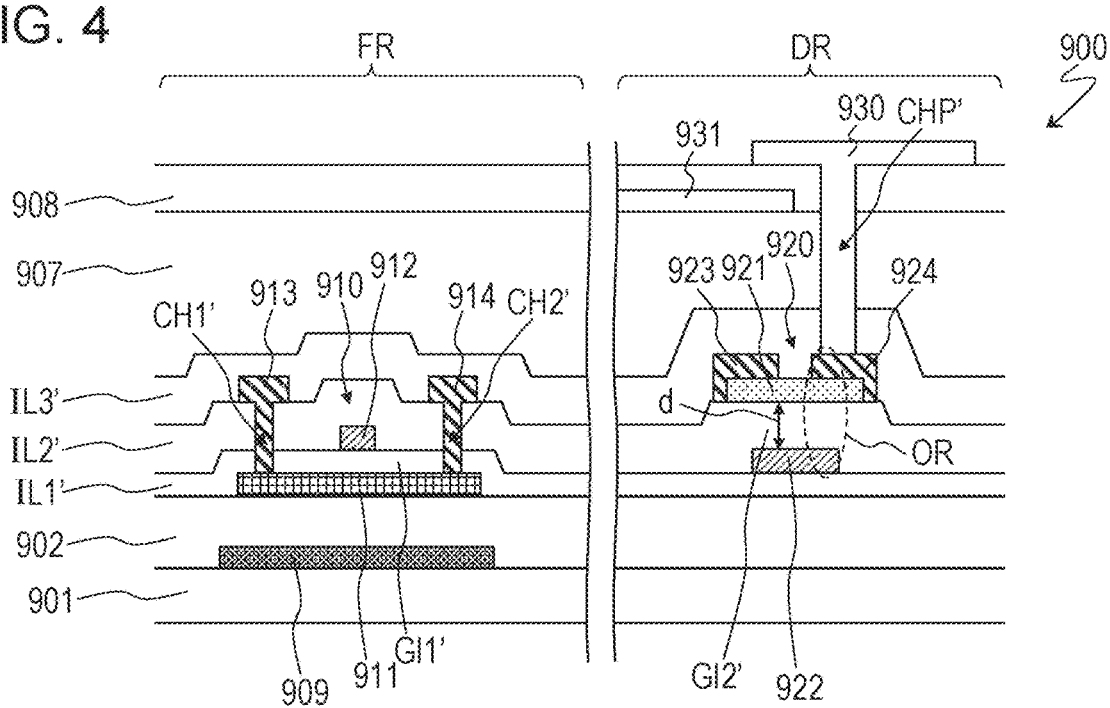
FIG. 4 is a cross-sectional view of an active matrix substrate 900, according to a comparative example.

In the active matrix substrate 100 of the present embodiment, because of the configuration described above, the pixel TFT (second TFT 20) has improved current driving ability, while the reliability of the circuit TFT (first TFT 10) is prevented from decreasing and display quality is prevented from decreasing. Reasons for this will be described below in comparison with an active matrix substrate of Comparative Example 1. FIG. 4 is a cross-sectional view of an active matrix substrate 900, according to Comparative Example 1.

As illustrated in FIG. 4, the active matrix substrate 900, according to the comparative example, includes a substrate 901, a first TFT 910, and second TFT 920. The first TFT 910 and second TFT 920 are supported by the substrate 901. The first TFT 910 is disposed in the peripheral region FR. The second TFT 920 is disposed in the display region DR.

As will be described below, in the active matrix substrate 900 of Comparative Example 1, the first TFT 910 has a top-gate structure, and the second TFT 920 has a bottom-gate structure.

The first TFT 910 is a crystalline silicon TFT including a crystalline silicon semiconductor layer 911, which is an active layer. The first TFT 910 is a circuit TFT. The first TFT 910 includes a first gate insulating layer GI1', a first gate electrode 912, a first source electrode 913, and a first drain electrode 914, in addition to the above-mentioned crystalline silicon semiconductor layer 911.

The crystalline silicon semiconductor layer 911 is provided on a base coat layer 902, which is formed on the substrate 901. A light blocking layer 909 is provided below the crystalline silicon semiconductor layer 911 to overlap the crystalline silicon semiconductor layer 911. The first gate insulating layer GI1' is provided on the crystalline silicon semiconductor layer 911. More specifically, a first insulating layer IL1', which includes the first gate insulating layer GI1', is formed on the base coat layer 902 and the crystalline silicon semiconductor layer 911, and a portion of the first insulating layer IL1' (a portion that covers the crystalline silicon semiconductor layer 911) serves as the first gate insulating layer GI1'.

The first gate electrode 912 is provided on the first gate insulating layer GI1' and faces the crystalline silicon semiconductor layer 911 with the first gate insulating layer GI1' disposed therebetween. The first source electrode 913 and the first drain electrode 914 are electrically connected to the crystalline silicon semiconductor layer 911. A second insulating layer IL2', which includes a portion that covers the first gate electrode 912, is provided on the first insulating layer IL1'. The first source electrode 913 and the first drain electrode 914 are provided on the second insulating layer IL2'. The first source electrode 913 and the first drain electrode 914 are connected to the crystalline silicon semiconductor layer 911, respectively via a first contact hole CH1' and a second contact hole CH2', which are formed in the first insulating layer IL1' and the second insulating layer IL2'.

The second TFT 920 is an oxide semiconductor TFT including an oxide semiconductor layer 921, which is an active layer. The second TFT 920 is a pixel TFT. The second TFT 920 includes a second gate insulating layer GI2', a second gate electrode 922, a second source electrode 923, and a second drain electrode 924, in addition to the above-mentioned oxide semiconductor layer 921.

The second gate electrode 922 is provided on the first insulating layer IL1'. The second gate electrode 922 is covered with the second insulating layer IL2'. A portion of the second insulating layer IL2', which is a portion that covers the second gate electrode 922, serves as the second gate insulating layer GI2'.

The oxide semiconductor layer 921 is provided on the second gate insulating layer GI2' and faces the second gate electrode 922 with the second gate insulating layer GI2 disposed therebetween. The second source electrode 923 and the second drain electrode 924 are each provided in contact with the upper surface of the oxide semiconductor layer 921.

A third insulating layer IL3' is provided on the second insulating layer IL2' to cover the first source electrode 913, the first drain electrode 914, the second source electrode 923, and the second drain electrode 924.

A planarization layer 907 is provided on the third insulating layer IL3', and a common electrode 931 is provided on the planarization layer 907. A dielectric layer 908 is provided to cover the common electrode 931, and a pixel electrode 930 is provided on the dielectric layer 908.

The pixel electrode 930 is connected to the second drain electrode 924 via a pixel contact hole CHP', which is formed in the third insulating layer IL3', the planarization layer 907, and the dielectric layer 908.

As described above, in the active matrix substrate 900 of Comparative Example 1, the first TFT 910, which is a circuit TFT, has a top-gate structure, and the second TFT 920, which is a pixel TFT, has a bottom-gate structure. In the second TFT 920, which has a bottom-gate structure, a thickness d of the second gate insulating layer GI2' is large because a voltage breakdown resistance between the source and the gate needs to be ensured, and therefore the current driving ability is reduced.

By increasing the gate voltage Vg (i.e., increasing the high-level potential Vgh of the gate signal), the on-state current Ion of the second TFT 920 can be increased, that is, the current driving ability can be increased. However, the first TFT 910, which is a circuit TFT, is a crystalline silicon TFT and has a low voltage breakdown resistance, and therefore, when a high high-level potential Vgh is supplied as the gate voltage Vg, there is a possibility that the leakage current may increase and reliability may decrease.

Furthermore, in consideration of alignment accuracy and the like, the second TFT 920, which has a bottom-gate structure, is designed such that there is a region in which the second drain electrode 924 overlaps the second gate electrode 922 (a region OR, encircled by the dotted line in FIG. 4) as viewed in a direction normal to the substrate. As such, a gate-drain capacitance Cgd is relatively large, and variations in the gate-drain capacitance Cgd are large. Consequently, the in-plane flicker distribution increases, which results in a degradation of display quality.

As described above, in the case of the active matrix substrate 900 of Comparative Example 1, improving the current driving ability of the pixel TFT (second TFT 920) results in degradations of the reliability of the circuit TFT (first TFT 910) and display quality.

In contrast, in the active matrix substrate 100 of the present embodiment, the first TFT 10 and the second TFT 20 each have a top-gate structure. That is, not only the first TFT 10, which is a circuit TFT, but also the second TFT 20, which is a pixel TFT, has a top-gate structure.

Since the second TFT 20 has a top-gate structure, there is no region in which the second gate electrode 22 overlaps the second source electrode 23 only via the second gate insulating layer GI2, and therefore, the thickness of the second gate insulating layer GI2 is reduced. As a result, the second TFT 20 has an increased current driving ability. Furthermore, the second gate electrode 22 and the second drain electrode 24 need not be disposed to overlap each other, which results in a reduction in the gate-drain capacitance Cgd. As a result, the in-plane flicker distribution is significantly reduced, and therefore, display quality is inhibited from being degraded.

Note that in the case where the second light blocking layer 9b is formed of an electrically conductive material, the second light blocking layer 9b may be electrically connected to the second gate electrode 22. In this case, the gate voltage that is applied to the second gate electrode 22 is also applied to the second light blocking layer 9b, and accordingly, the second light blocking layer 9b can serve as an additional gate electrode (back gate electrode) of the second TFT 20. As a result, the on-state current of the second TFT 20 can be further increased, and therefore the current driving ability thereof can be further improved. In the case where the second light blocking layer 9b is electrically connected to the second gate electrode 22, it is preferable that the oxide semiconductor layer 21 not have a multilayer structure (be a single layer).

Next, an example of a method for manufacturing the active matrix substrate 100 will be described. FIG. 5 to FIG. 9 are cross-sectional views of a process, which illustrate a method for manufacturing the active matrix substrate 100.

Figure 5A:
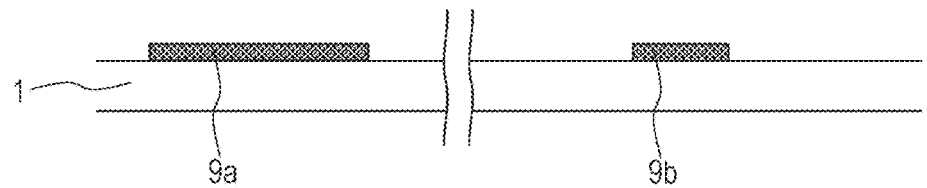
FIGS. 5(a) to 5(d) are cross-sectional views of a process, which illustrate a method for manufacturing the active matrix substrate 100.

First, as illustrated in FIG. 5(a), the first light blocking layer 9a and the second light blocking layer 9b are formed on the substrate 1. Specifically, the first light blocking layer 9a and the second light blocking layer 9b can be formed by depositing a light blocking film on the substrate 1 and thereafter patterning the light blocking film. A material for the light blocking film is a MoW alloy, for example. The first light blocking layer 9a and the second light blocking layer 9b each have a thickness of 50 nm or greater and 500 nm or less, for example.

Figure 5B:
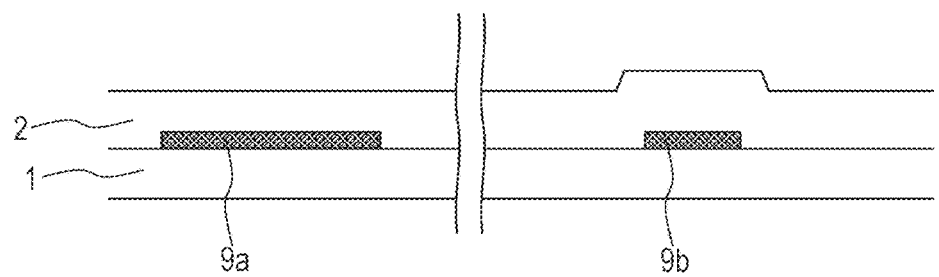

Next, as illustrated in FIG. 5(b), the base coat layer 2 is formed to cover the substrate 1, the first light blocking layer 9a, and the second light blocking layer 9b. For example, the base coat layer 2 has a multilayer structure including a silicon nitride (SiNx) layer, which is a lower layer, and a silicon oxide (SiOx) layer, which is an upper layer. Of course, this example is non-limiting.

Figure 5C:
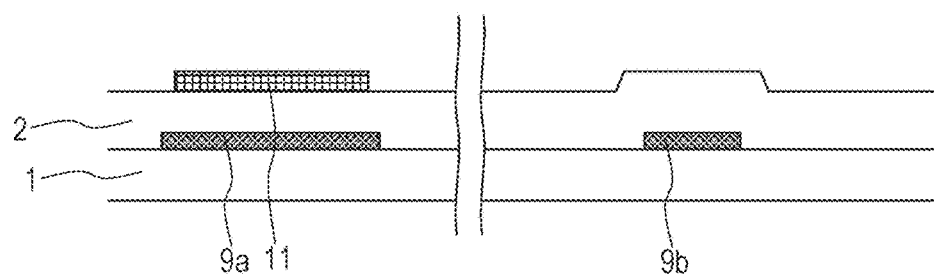

Subsequently, as illustrated in FIG. 5(c), the crystalline silicon semiconductor layer 11 (in this case, a polycrystalline silicon layer) is formed on the base coat layer 2. Specifically, a polycrystalline silicon film is formed by first depositing an amorphous silicon (a-Si) film on the base coat layer 2 and then crystallizing the amorphous silicon film. The amorphous silicon film can be deposited by, for example, using a plasma CVD method, a sputtering method, or the like. The amorphous silicon film can be crystallized by, for example, irradiation with excimer laser light. Subsequently, the polycrystalline silicon film can be patterned to form the crystalline silicon semiconductor layer 11, which is in the form of an island. The crystalline silicon semiconductor layer 11 has a thickness of 30 nm or greater and 100 nm or less, for example.

Figure 5D:
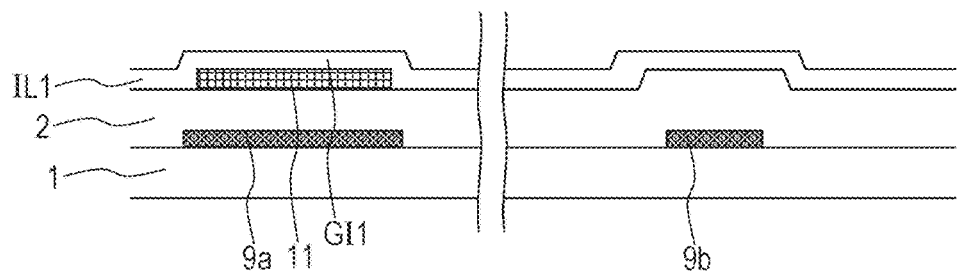

Thereafter, as illustrated in FIG. 5(d), the first insulating layer IL1, which includes the first gate insulating layer GI1, is formed to cover the base coat layer 2 and the crystalline silicon semiconductor layer 11. The first insulating layer IL1 is a silicon oxide (SiOx) layer, for example. The first insulating layer IL1 has a thickness of 50 nm or greater and 200 nm or less, for example.

Figure 6A:
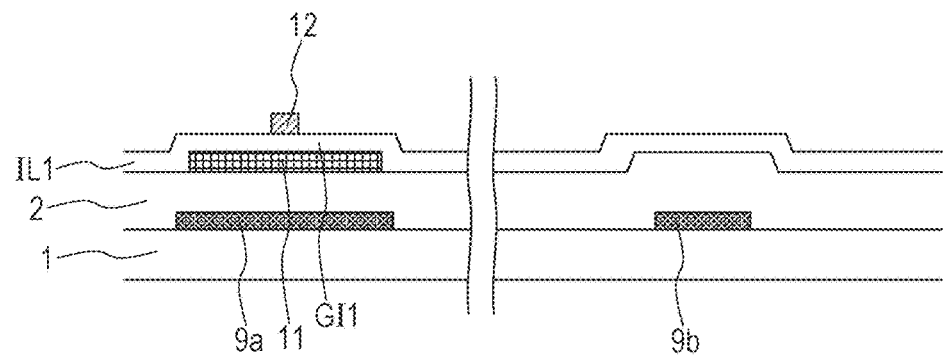
FIGS. 6(a) to 6(d) are cross-sectional views of the process, which illustrate the method for manufacturing the active matrix substrate 100.

Next, as illustrated in FIG. 6(a), the first gate electrode 12 is formed on the first insulating layer IL1 in a manner such that the first gate electrode 12 faces the crystalline silicon semiconductor layer 11 with the first insulating layer IL1 disposed therebetween. Specifically, the first gate electrode 12 can be formed by depositing an electrically conductive film for the gate on the first insulating layer IL1 and thereafter patterning the electrically conductive film for the gate. Examples of materials for the electrically conductive film for the gate include metals, such as molybdenum (Mo), tungsten (W), aluminum (Al), copper (Cu), titanium (Ti), and tantalum (Ta), and alloys thereof. The first gate electrode 12 may have a multilayer structure including a plurality of layers formed of different electrically conductive materials. The first gate electrode 12 has a thickness of 50 nm or greater and 500 nm or less, for example.

Subsequently, the source region and the drain region are formed by implanting an impurity into the crystalline silicon semiconductor layer 11 with the first gate electrode 12 used as a mask. In the crystalline silicon semiconductor layer 11, the region in which no impurities are implanted forms the channel region (active region).

Figure 6B:
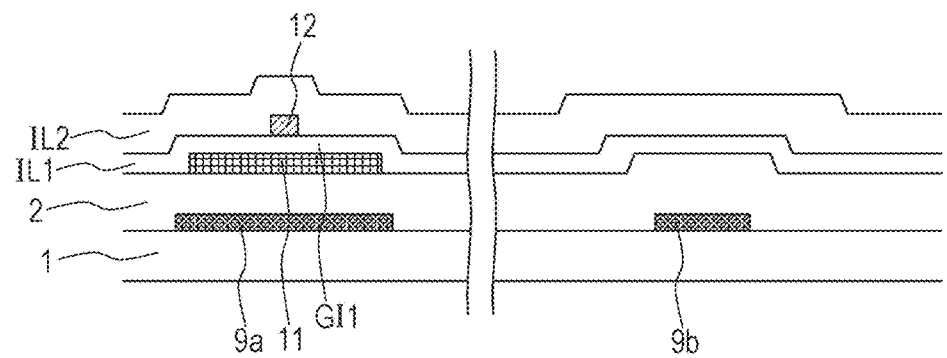

Thereafter, as illustrated in FIG. 6(b), the second insulating layer IL2 is formed to cover the first insulating layer IL1 and the first gate electrode 12. The second insulating layer IL2 is, for example, a silicon oxide (SiOx) layer, a silicon nitride (SiNx) layer, or a silicon oxynitride (SiNxOy) layer. The second insulating layer IL2 has a thickness of 150 nm or greater and 500 nm or less, for example.

Figure 6C:
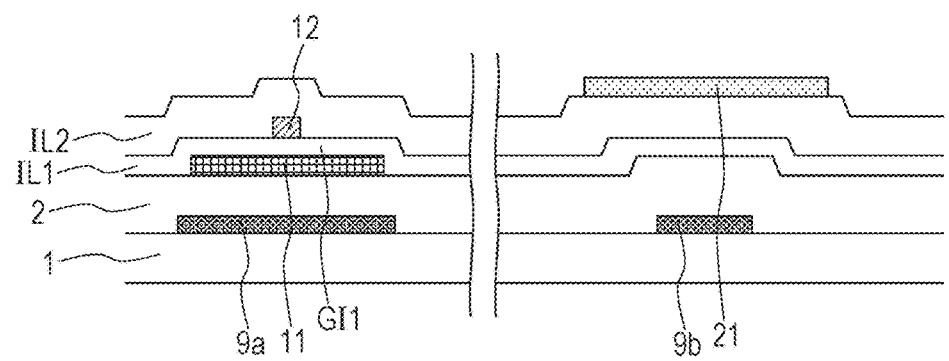

Next, as illustrated in FIG. 6(c), the oxide semiconductor layer 21 is formed on the second insulating layer IL2. Specifically, the oxide semiconductor layer 21 can be formed by depositing an oxide semiconductor film on the second insulating layer IL2 and thereafter patterning the oxide semiconductor film. The oxide semiconductor layer 21 has a thickness of 10 nm or greater and 150 nm or less, for example.

Figure 6D:
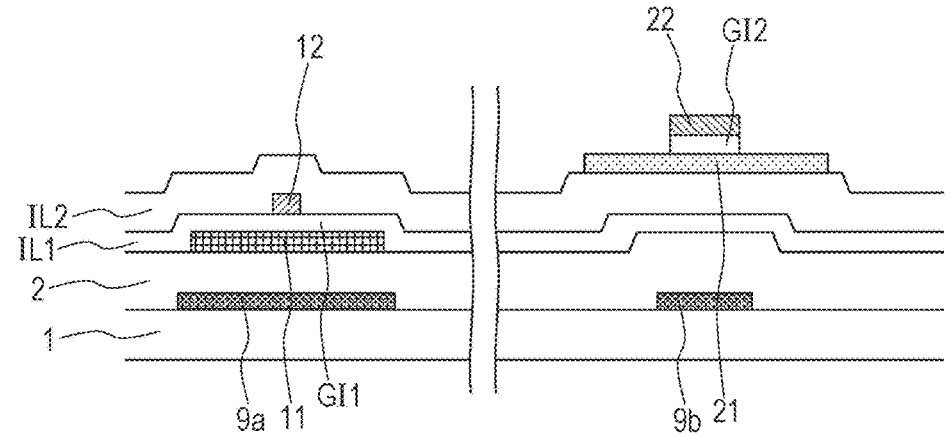

Subsequently, as illustrated in FIG. 6(d), the second gate insulating layer GI2 and the second gate electrode 22 are formed on the oxide semiconductor layer 21. Specifically, an insulating film is first deposited to cover the oxide semiconductor layer 21, and thereafter an electrically conductive film for the gate is deposited thereon. Next, the electrically conductive film for the gate is patterned to form the second gate electrode 22. Thereafter, the portion of the insulating film not covered with the second gate electrode 22 is removed by performing etching by using the second gate electrode 22 as a mask. In this manner, the second gate insulating layer GI2 can be formed. The second gate insulating layer GI2 is a silicon oxide (SiOx) layer, for example. The second gate insulating layer GI2 has a thickness of 80 nm or greater and 250 nm or less. As a material for the electrically conductive film for the gate that forms the second gate electrode 22, a metal, such as molybdenum (Mo), tungsten (W), aluminum (Al), copper (Cu), titanium (Ti), or tantalum (Ta), or an alloy thereof may be used. As a material for the electrically conductive film for the gate, a metal oxide (e.g., ITO) may be used, or an oxide semiconductor (e.g., an In—Ga—Zn—O system semiconductor) may be used after converting the oxide semiconductor to a low-resistance state. When a metal oxide or an oxide semiconductor is used as a material for the electrically conductive film for the gate, oxygen present therein (or oxygen that is used when forming the film) is supplied to the oxide semiconductor of the channel region, which produces an effect of preventing the channel region from becoming conductive as a result of oxygen deficiency. The second gate electrode 22 has a thickness of 30 nm or greater and 500 nm or less, for example.

Figure 7A:
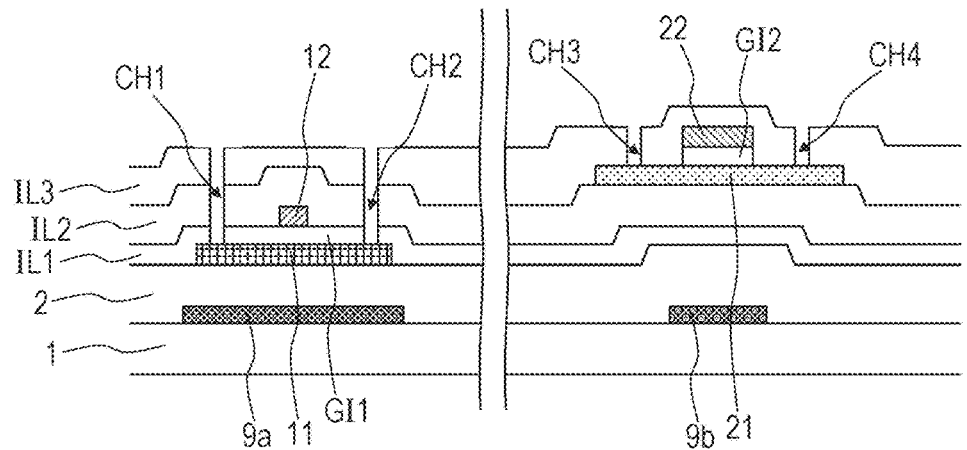
FIGS. 7(a) to 7(c) are cross-sectional views of the process, which illustrate the method for manufacturing the active matrix substrate 100.

Next, as illustrated in FIG. 7(a), the third insulating layer IL3 is formed to cover the oxide semiconductor layer 21, the second gate insulating layer GI2, and the second gate electrode 22. The third insulating layer IL3 is, for example, a silicon oxide (SiOx) layer, a silicon nitride (SiNx) layer, or a silicon oxynitride (SiNxOy) layer. The third insulating layer IL3 may have a multilayer structure in which two or more of these layers are stacked together. The third insulating layer IL3 has a thickness of 150 nm or greater and 500 nm or less, for example. Thereafter, the first contact hole CH1 and the second contact hole CH2 are formed in the first insulating layer IL1, the second insulating layer IL2, and the third insulating layer IL3 to expose portions (the source region and the drain region) of the crystalline silicon semiconductor layer 11. Furthermore, the third contact hole CH3 and the fourth contact hole CH4 are formed in the third insulating layer IL3 to expose portions (the source contact region and the drain contact region) of the oxide semiconductor layer 21.

Figure 7B:
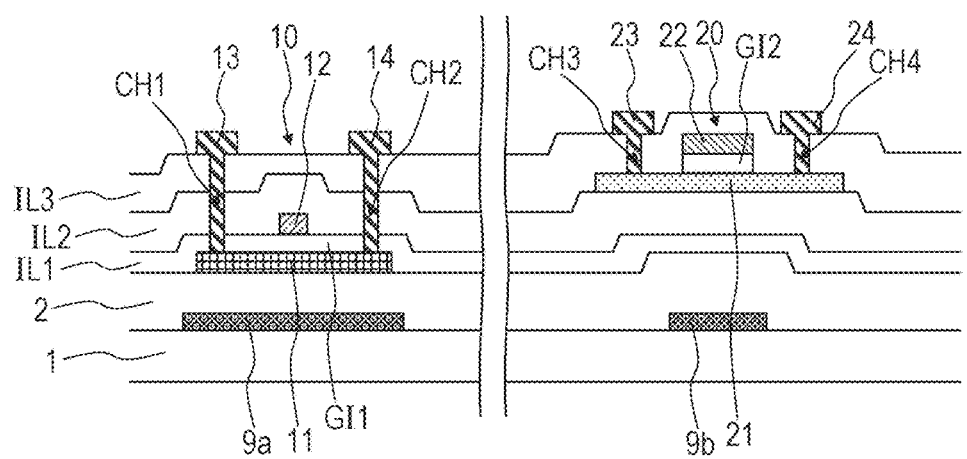

Subsequently, as illustrated in FIG. 7(b), the first source electrode 13, the first drain electrode 14, the second source electrode 23, and the second drain electrode 24 are formed on the third insulating layer IL3. Specifically, the first source electrode 13, the first drain electrode 14, the second source electrode 23, and the second drain electrode 24 can be formed by depositing, on the third insulating layer IL3, an electrically conductive film for the source and drain and thereafter patterning the electrically conductive film for the source and drain. Examples of materials for the electrically conductive film for the source and drain include metals, such as molybdenum (Mo), tungsten (W), aluminum (Al), copper (Cu), titanium (Ti), and tantalum (Ta), and alloys thereof.

The first source electrode 13, the first drain electrode 14, the second source electrode 23, and the second drain electrode 24 each have a thickness of 100 nm or greater and 500 nm or less, for example.

Figure 7C:
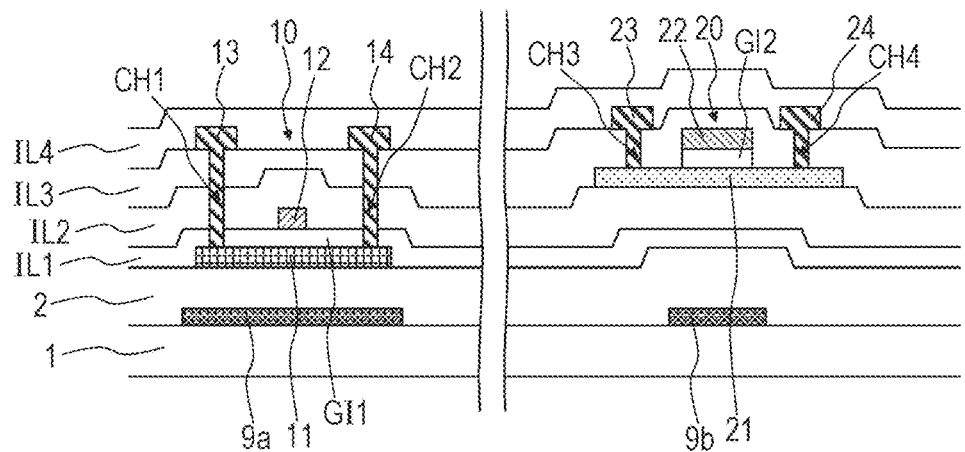

Thereafter, as illustrated in FIG. 7(c), the fourth insulating layer IL4 is formed to cover the third insulating layer IL3, the first source electrode 13, the first drain electrode 14, the second source electrode 23, and the second drain electrode 24. The fourth insulating layer IL4 is a silicon nitride (SiNx) layer, for example. The fourth insulating layer IL4 has a thickness of 100 nm or greater and 500 nm or less, for example. Note that the fourth insulating layer IL4 may be omitted.

Figure 8A:
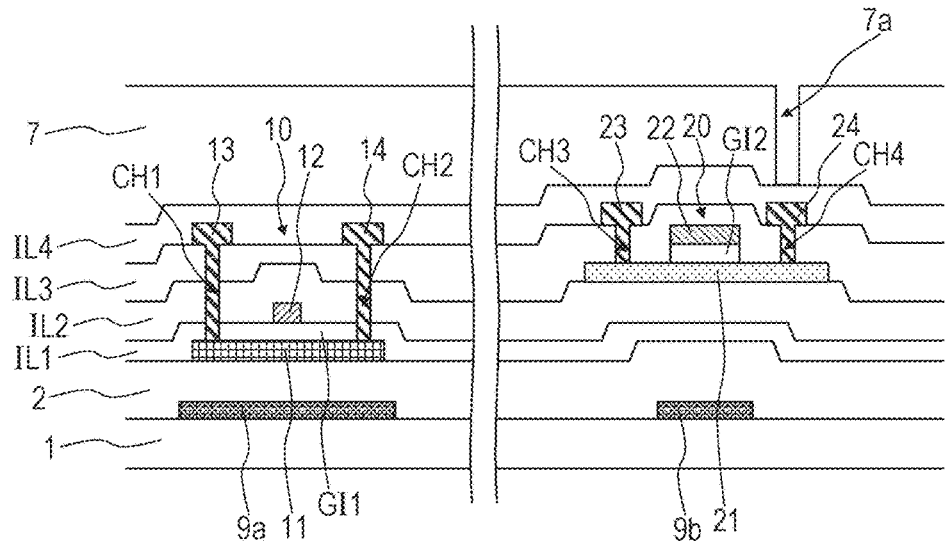
FIGS. 8(a) and 8(b) are cross-sectional views of the process which illustrate the method for manufacturing the active matrix substrate 100.

Next, as illustrated in FIG. 8(a), the planarization layer 7 is formed on the fourth insulating layer IL4. The planarization layer 7 is formed from a photosensitive resin material, for example. The planarization layer 7 has a thickness of 1.5 m or greater and 3.0 μm or less, for example. An opening 7a is formed in a region of the planarization layer 7, which is a region that later forms the pixel contact hole CHP.

Figure 8B:
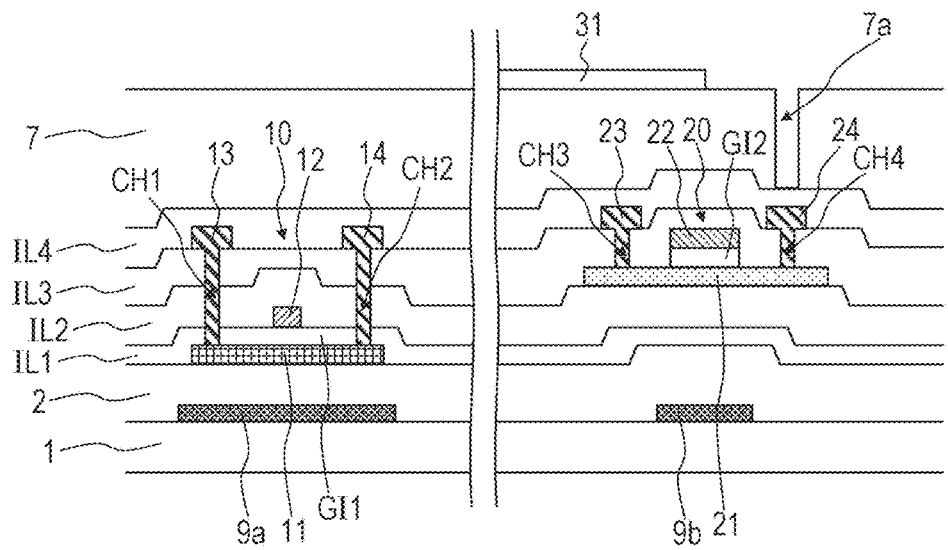

Subsequently, as illustrated in FIG. 8(b), the common electrode 31 is formed on the planarization layer 7. Specifically, the common electrode 31 can be formed by depositing a transparent electrically conductive film on the planarization layer 7 and thereafter patterning the transparent electrically conductive film. Examples of materials for the transparent electrically conductive film include ITO. The common electrode 31 has a thickness of 40 nm or greater and 150 nm or less, for example.

Figure 9A:
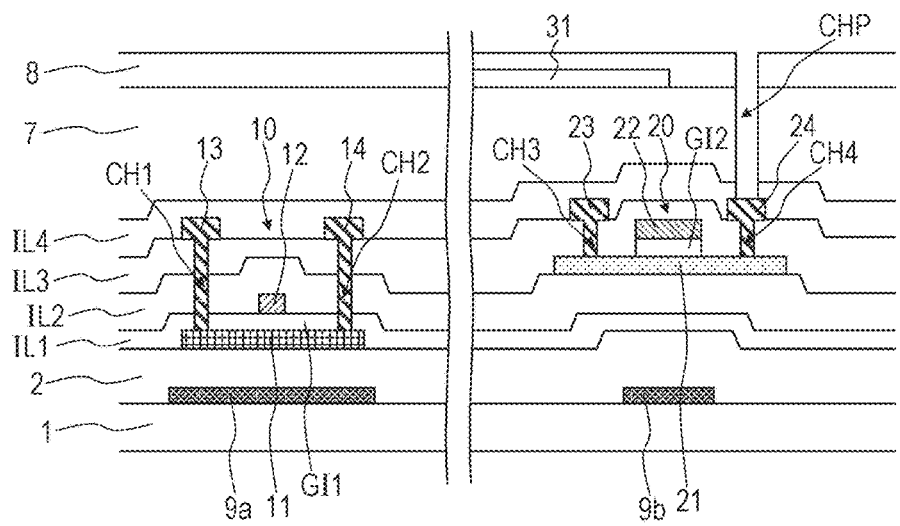
FIGS. 9(a) and 9(b) are cross-sectional views of the process, which illustrate the method for manufacturing the active matrix substrate 100.

Next, as illustrated in FIG. 9(a), the dielectric layer 8 is formed to cover the planarization layer 7 and the common electrode 31. The dielectric layer 8 is a silicon nitride (SiNx) layer, for example. The dielectric layer 8 has a thickness of 100 nm or greater and 400 nm or less, for example. Subsequently, the pixel contact hole CHP is formed by forming an opening in regions of the dielectric layer 8 and the fourth insulating layer IL4, which are regions that form the pixel contact hole CHP.

Figure 9B:
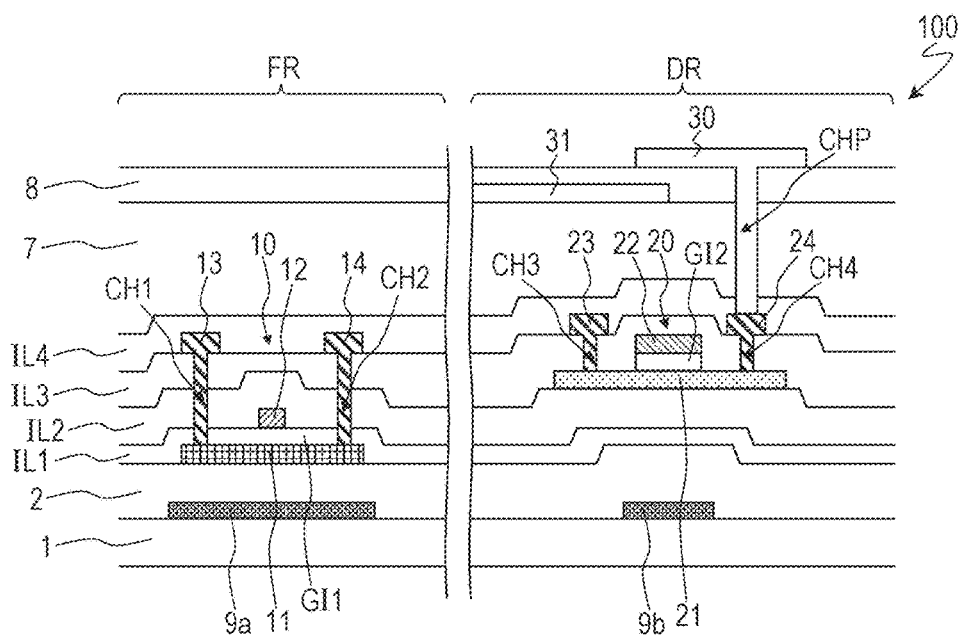

Thereafter, as illustrated in FIG. 9(b), the pixel electrode 30 is formed on the dielectric layer 8. Specifically, the pixel electrode 30 can be formed by depositing a transparent electrically conductive film on the dielectric layer 8 and thereafter patterning the transparent electrically conductive film. Examples of materials for the transparent electrically conductive film include ITO. The pixel electrode 30 has a thickness of 40 nm or greater and 150 nm or less, for example. In the manner described above, the active matrix substrate 100 can be obtained.

Second Embodiment

Figure 10:
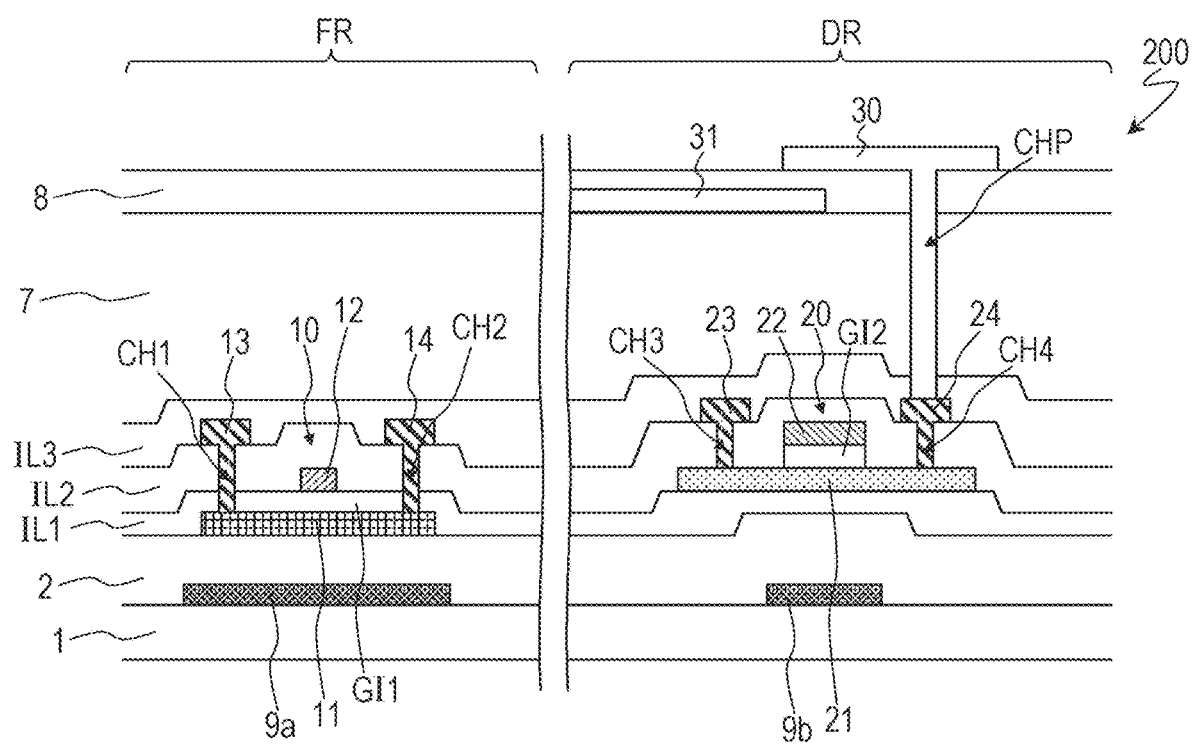
FIG. 10 is a schematic cross-sectional view of an active matrix substrate 200, according to an embodiment of the present invention.

An active matrix substrate 200, according to the present embodiment, will be described with reference to FIG. 10. FIG. 10 is a schematic cross-sectional view of the active matrix substrate 200.

The active matrix substrate 200 of the present embodiment is different from the active matrix substrate 100 of the first embodiment in the number of insulating layers stacked. In the active matrix substrate 100 of the first embodiment, five insulating layers are stacked together between the base coat layer 2 and the planarization layer 7. Specifically, the first insulating layer IL1 (including the first gate insulating layer GI1), the second insulating layer IL2, the second gate insulating layer GI2, the third insulating layer IL3, and the fourth insulating layer IL4 are stacked together. In contrast, in the active matrix substrate 200 of the present embodiment, as will be described later, four insulating layers are stacked together between the base coat layer 2 and planarization layer 7. Specifically, a first insulating layer IL1 (including a first gate insulating layer GI1), a second gate insulating layer GI2, a second insulating layer IL2, and a third insulating layer IL3 are stacked together.

As illustrated in FIG. 10, the active matrix substrate 200 includes the first TFT 10 and the second TFT 20. The first TFT 10 is a circuit TFT and disposed in the peripheral region FR. The second TFT 20 is a pixel TFT and disposed in the display region DR.

The first TFT 10 is a crystalline silicon TFT including the crystalline silicon semiconductor layer 11, which is an active layer. The first TFT 10 includes a first gate insulating layer GI1, a first gate electrode 12, a first source electrode 13, and a first drain electrode 14, in addition to the crystalline silicon semiconductor layer 11.

The crystalline silicon semiconductor layer 11 is provided on the base coat layer 2. The first gate insulating layer GI1 is provided on the crystalline silicon semiconductor layer 11. The first insulating layer IL1, which includes the first gate insulating layer GI1, is formed on the base coat layer 2 and the crystalline silicon semiconductor layer 11, and a portion of the first insulating layer IL1 (a portion that covers the crystalline silicon semiconductor layer 11) serves as the first gate insulating layer GI1.

The first gate electrode 12 is provided on the first gate insulating layer GI1. The first gate electrode 12 faces the crystalline silicon semiconductor layer 11 with the first gate insulating layer GI1 disposed therebetween.

The first source electrode 13 and the first drain electrode 14 are electrically connected to the crystalline silicon semiconductor layer 11. In the present embodiment, the second insulating layer IL2, which includes a portion that covers the first gate electrode 12, is provided on the first insulating layer IL1. The first source electrode 13 and the first drain electrode 14 are provided on the second insulating layer IL2. The first source electrode 13 and the first drain electrode 14 are connected to the crystalline silicon semiconductor layer 11, respectively via a first contact hole CH1 and a second contact hole CH2, which are formed in the first insulating layer IL1 (first gate insulating layer GI1) and the second insulating layer IL2.

The second TFT 20 is an oxide semiconductor TFT including the oxide semiconductor layer 21, which is an active layer. The second TFT 20 includes a second gate insulating layer GI2, a second gate electrode 22, a second source electrode 23, and a second drain electrode 24, in addition to the oxide semiconductor layer 21.

The oxide semiconductor layer 21 is provided on the first insulating layer IL1. The second gate insulating layer GI2 is provided on the oxide semiconductor layer 21.

The second gate insulating layer GI2 is formed only on a region that overlaps the second gate electrode 22 and is in the form of an island.

The second gate electrode 22 is provided on the second gate insulating layer GI2. The second gate electrode 22 faces the oxide semiconductor layer 21 with the second gate insulating layer GI2 disposed therebetween.

The second source electrode 23 and the second drain electrode 24 are electrically connected to the oxide semiconductor layer 21. The second insulating layer IL2 includes a portion that covers the oxide semiconductor layer 21, the second gate insulating layer GI2, and the second gate electrode 22. The second source electrode 23 and the second drain electrode 24 are provided on the second insulating layer IL2. The second source electrode 23 and the second drain electrode 24 are connected to the oxide semiconductor layer 21, respectively via a third contact hole CH3 and a fourth contact hole CH4, which are formed in the second insulating layer IL2. The second gate electrode 22 does not overlap the second source electrode 23 or the second drain electrode 24 as viewed in a direction normal to the surface of the substrate.

The third insulating layer IL3 is provided on the second insulating layer IL2 to cover the first source electrode 13, the first drain electrode 14, the second source electrode 23, and the second drain electrode 24.

As described above, the first TFT 10 and the second TFT 20 each have a top-gate structure.

The planarization layer 7 is provided on the third insulating layer IL3, and the common electrode 31 is provided on the planarization layer 7. The dielectric layer 8 is provided to cover the common electrode 31, and the pixel electrode 30 is provided on the dielectric layer 8. The pixel electrode 30 is connected to the second drain electrode 24 via a pixel contact hole CHP, which is formed in the third insulating layer IL3, the planarization layer 7, and the dielectric layer 8.

The first light blocking layer 9a is provided below the crystalline silicon semiconductor layer 11. The first light blocking layer 9a overlaps the crystalline silicon semiconductor layer 11 as viewed in a direction normal to the surface of the substrate. Furthermore, the second light blocking layer 9b is provided below the oxide semiconductor layer 21. The second light blocking layer 9b overlaps the oxide semiconductor layer 21 as viewed in a direction normal to the surface of the substrate.

In the active matrix substrate 200 of the present embodiment, too, the first TFT 10 and the second TFT 20 each have a top-gate structure, and consequently the pixel TFT (second TFT 20) has improved current driving ability, while the reliability of the circuit TFT (first TFT 10) is prevented from decreasing and display quality is prevented from decreasing, as in the active matrix substrate 100 of the first embodiment.

Furthermore, with the active matrix substrate 200 of the present embodiment, in which the number of insulating layers stacked is smaller than in the active matrix substrate 100 of the first embodiment, the number of manufacturing steps can be reduced, thereby achieving a reduction in manufacturing cost.

Note that in the active matrix substrate 200 of the present embodiment, too, in the case where the second light blocking layer 9b is formed of an electrically conductive material, the second light blocking layer 9b may be electrically connected to the second gate electrode 22, as in the active matrix substrate 100 of the first embodiment. In this case, the second light blocking layer 9b can serve as an additional gate electrode (back gate electrode) of the second TFT 20, and as a result, the on-state current of the second TFT 20 can be further increased, and therefore the current driving ability thereof can be further improved.

Next, an example of a method for manufacturing the active matrix substrate 200 will be described. FIG. 11 and FIG. 12 are cross-sectional views of a process, which illustrate a method for manufacturing the active matrix substrate 200.

Figure 11A:
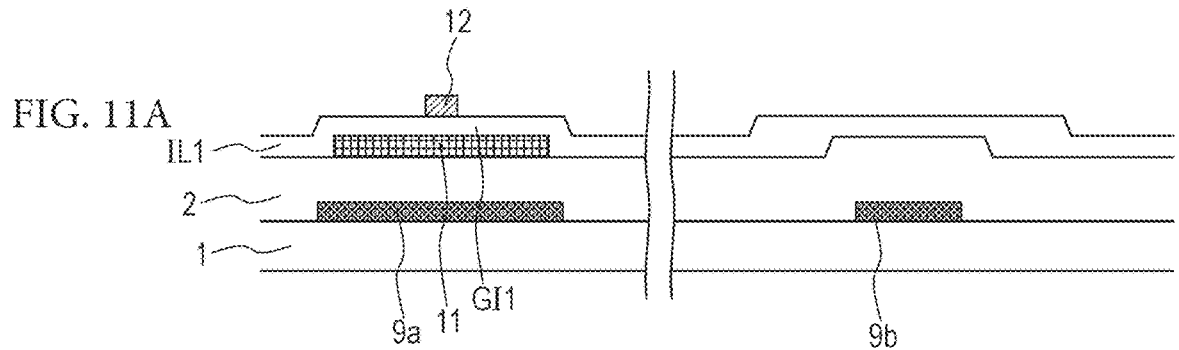
FIGS. 11(a) to 11(d) are cross-sectional views of a process, which illustrate a method for manufacturing the active matrix substrate 200.

First, as illustrated in FIG. 11(a), the first light blocking layer 9a, the second light blocking layer 9b, the base coat layer 2, the crystalline silicon semiconductor layer 11, the first insulating layer IL1 (including the first gate insulating layer GI1), and the first gate electrode 12 are formed successively on the substrate 1. These steps can be performed in a manner similar to that for the steps described above with reference to FIG. 5(a) to FIG. 6(a), regarding the active matrix substrate 100 of the first embodiment. Thereafter, the source region and the drain region are formed by implanting an impurity into the crystalline silicon semiconductor layer 11 with the first gate electrode 12 used as a mask. In the crystalline silicon semiconductor layer 11, the region in which no impurities are implanted forms the channel region (active region).

Figure 11B:
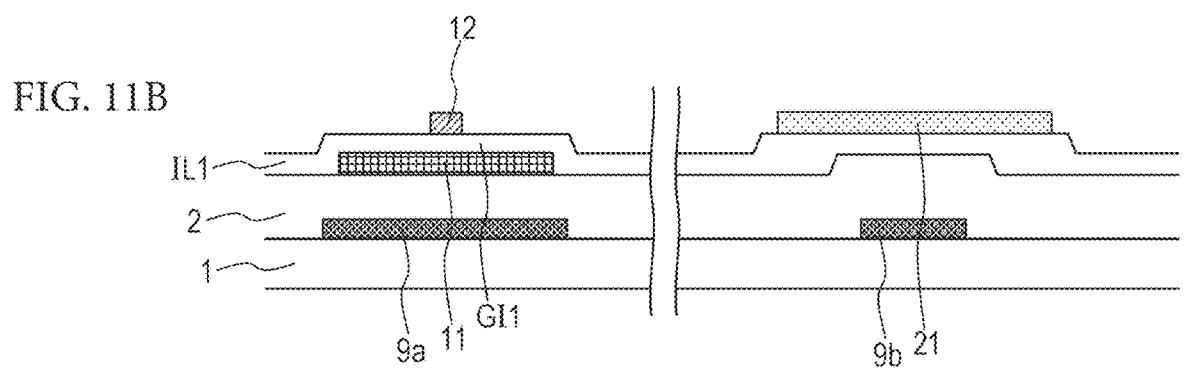

Next, as illustrated in FIG. 11(b), the oxide semiconductor layer 21 is formed on the first insulating layer IL1. Specifically, the oxide semiconductor layer 21 can be formed by depositing an oxide semiconductor film on the first insulating layer IL1 and thereafter patterning the oxide semiconductor film. The oxide semiconductor 21 has a thickness of 10 nm or greater and 150 nm or less, for example.

Figure 11C:
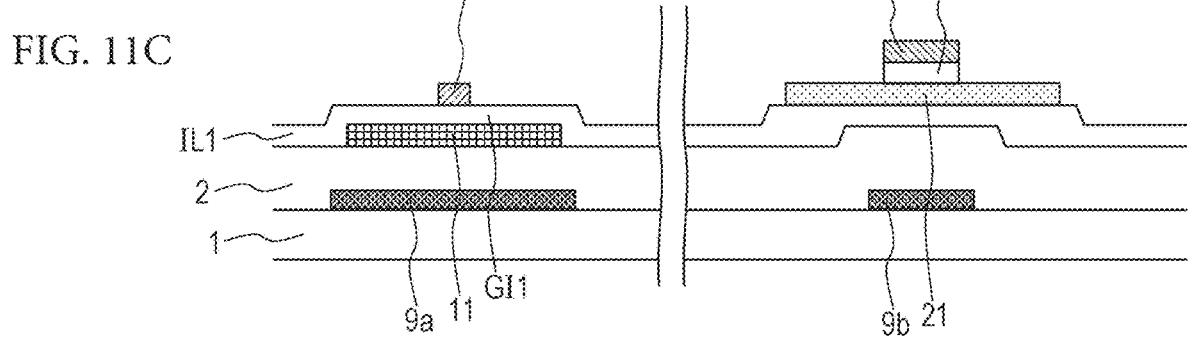

Subsequently, as illustrated in FIG. 11(c), the second gate insulating layer GI2 and the second gate electrode 22 are formed on the oxide semiconductor layer 21. Specifically, an insulating film is first deposited to cover the oxide semiconductor layer 21, and thereafter an electrically conductive film for the gate is deposited thereon. Next, the electrically conductive film for the gate is patterned to form the second gate electrode 22. Thereafter, the portion of the insulating film not covered with the second gate electrode 22 is removed by performing etching by using the second gate electrode 22 as a mask. In this manner, the second gate insulating layer GI2 can be formed. The second gate insulating layer GI2 is a silicon oxide (SiOx) layer, for example. The second gate insulating layer GI2 has a thickness of 80 nm or greater and 250 nm or less, for example. As a material for the electrically conductive film for the gate that forms the second gate electrode 22, a metal, such as molybdenum (Mo), tungsten (W), aluminum (Al), copper (Cu), titanium (Ti), or tantalum (Ta), or an alloy thereof may be used. As a material for the electrically conductive film for the gate, a metal oxide (e.g., ITO) may be used, or an oxide semiconductor (e.g., an In—Ga—Zn—O system semiconductor) may be used after converting the oxide semiconductor to a low-resistance state. The second gate electrode 22 has a thickness of 30 nm or greater and 500 nm or less, for example.

Figure 11D:
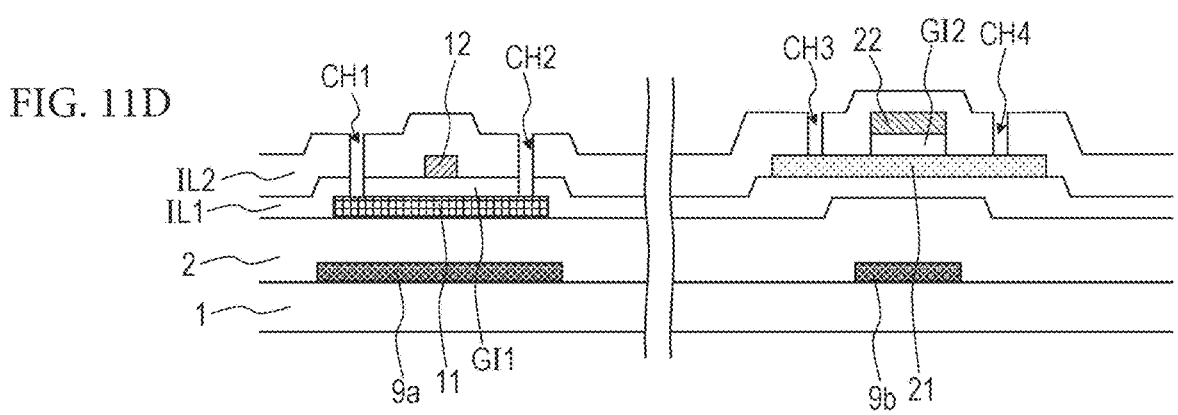

Thereafter, as illustrated in FIG. 11(d), the second insulating layer IL2 is formed to cover the first gate electrode 12, the oxide semiconductor layer 21, the second gate insulating layer GI2, and the second gate electrode 22. The second insulating layer IL2 is, for example, a silicon oxide (SiOx) layer, a silicon nitride (SiNx) layer, or a silicon oxynitride (SiNxOy) layer. The second insulating layer IL2 may have a multilayer structure in which two or more of these layers are stacked together. The second insulating layer IL2 has a thickness of 150 nm or greater and 500 nm or less, for example. Thereafter, the first contact hole CH1 and the second contact hole CH2 are formed in the first insulating layer IL1 and the second insulating layer IL2 to expose portions (the source region and the drain region) of the crystalline silicon semiconductor layer 11. Furthermore, the third contact hole CH3 and the fourth contact hole CH4 are formed in the second insulating layer IL2 to expose portions (the source contact region and the drain contact region) of the oxide semiconductor layer 21.

Figure 12A:
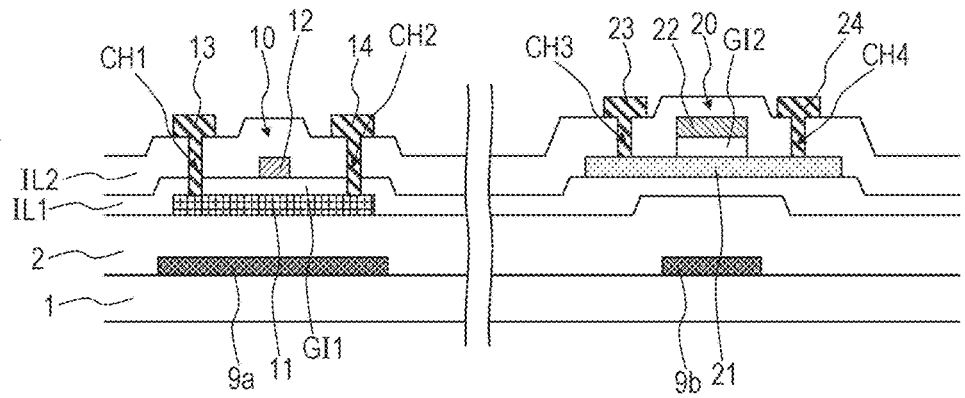
FIGS. 12(a) to 12(c) are cross-sectional views of the process, which illustrate the method for manufacturing the active matrix substrate 200.

Next, as illustrated in FIG. 12(a), the first source electrode 13, the first drain electrode 14, the second source electrode 23, and the second drain electrode 24 are formed on the second insulating layer IL2. Specifically, the first source electrode 13, the first drain electrode 14, the second source electrode 23, and the second drain electrode 24 can be formed by depositing, on the second insulating layer IL2, an electrically conductive film for the source and drain and thereafter patterning the electrically conductive film for the source and drain. Examples of materials for the electrically conductive film for the source and drain include metals, such as molybdenum (Mo), tungsten (W), aluminum (Al), copper (Cu), titanium (Ti), and tantalum (Ta), and alloys thereof. The first source electrode 13, the first drain electrode 14, the second source electrode 23, and the second drain electrode 24 each have a thickness of 100 nm or greater and 500 nm or less, for example.

Figure 12B:
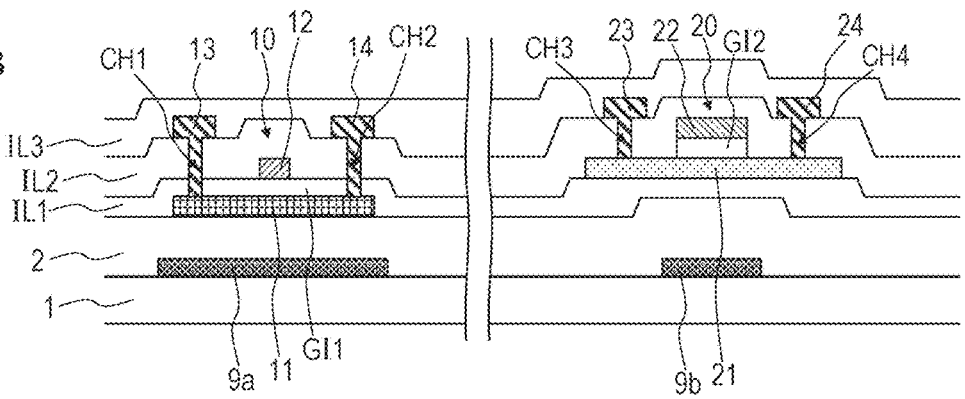

Subsequently, as illustrated in FIG. 12(b), the third insulating layer IL3 is formed to cover the second insulating layer IL2, the first source electrode 13, the first drain electrode 14, the second source electrode 23, and the second drain electrode 24. The third insulating layer IL3 is a silicon nitride (SiNx) layer, for example. The third insulating layer IL3 has a thickness of 100 nm or greater and 500 nm or less, for example. Note that the third insulating layer IL3 may be omitted.

Figure 12C:
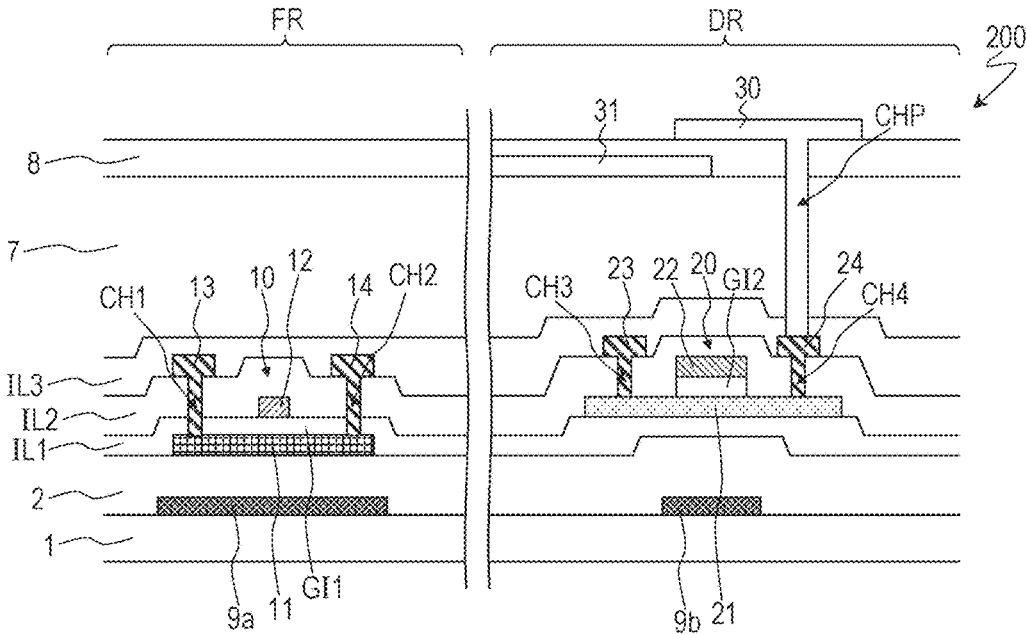

Thereafter, as illustrated in FIG. 12(c), the planarization layer 7, the common electrode 31, the dielectric layer 8, and the pixel electrode 30 are formed successively on the third insulating layer IL3. These steps can be performed in a manner similar to that for the steps described above with reference to FIG. 8(a) to FIG. 9(b), regarding the active matrix substrate 100 of the first embodiment. In the manner described above, the active matrix substrate 200 can be obtained.

Note that although the above description presents an example in which the oxide semiconductor film is patterned prior to formation of the second gate insulating layer GI2 and the second gate electrode 22, the oxide semiconductor film may be patterned after formation of the second gate insulating layer GI2 and the second gate electrode 22 as illustrated in FIG. 13.

Figure 13A:
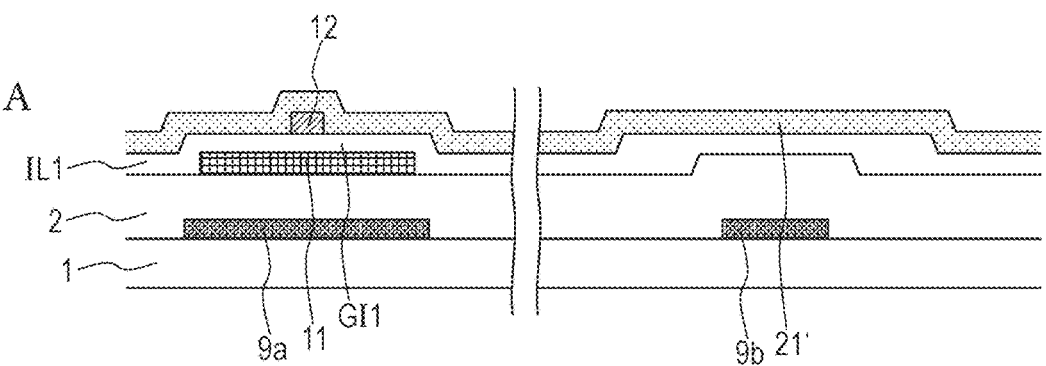
FIGS. 13(a) to 13(c) are cross-sectional views of a process, which illustrate a method for manufacturing the active matrix substrate 200.
Figure 13B:
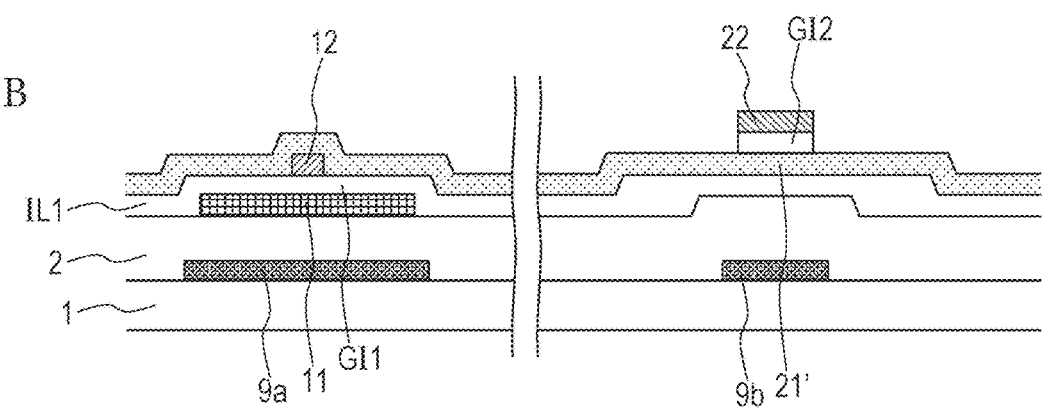
Figure 13C:
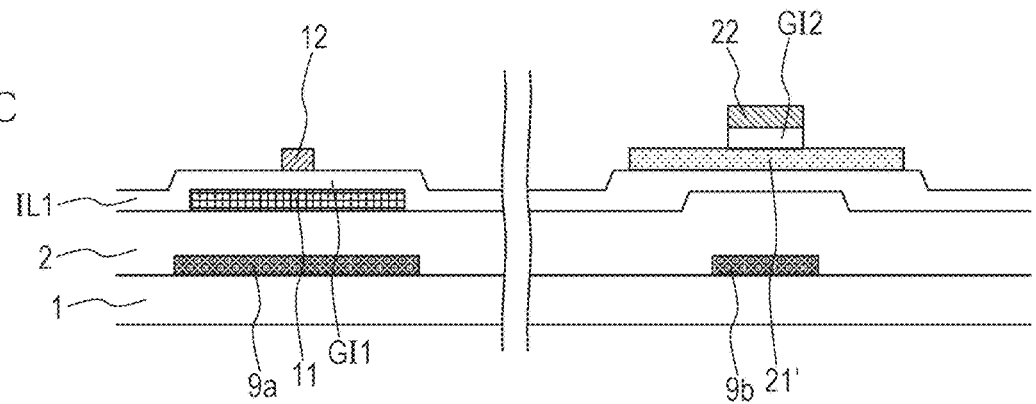

Specifically, first, an oxide semiconductor film 21' is deposited on the first insulating layer IL1, as illustrated in FIG. 13(a). Next, as illustrated in FIG. 13(b), the second gate insulating layer GI2 and the second gate electrode 22 are formed on the oxide semiconductor film 21'. Thereafter, as illustrated in FIG. 13(c), the oxide semiconductor film 21' is patterned to form the oxide semiconductor layer 21.

In the case where the oxide semiconductor film 21' is patterned after formation of the second gate insulating layer GI2 and the second gate electrode 22 as described above with reference to FIGS. 13(a) to 13(c), the oxide semiconductor film 21' serves as an etching stopper during etching of the insulating film from which the second gate insulating layer GI2 is formed, and therefore, the first insulating layer IL1 is prevented from being over-etched.

Third Embodiment

Figure 14:
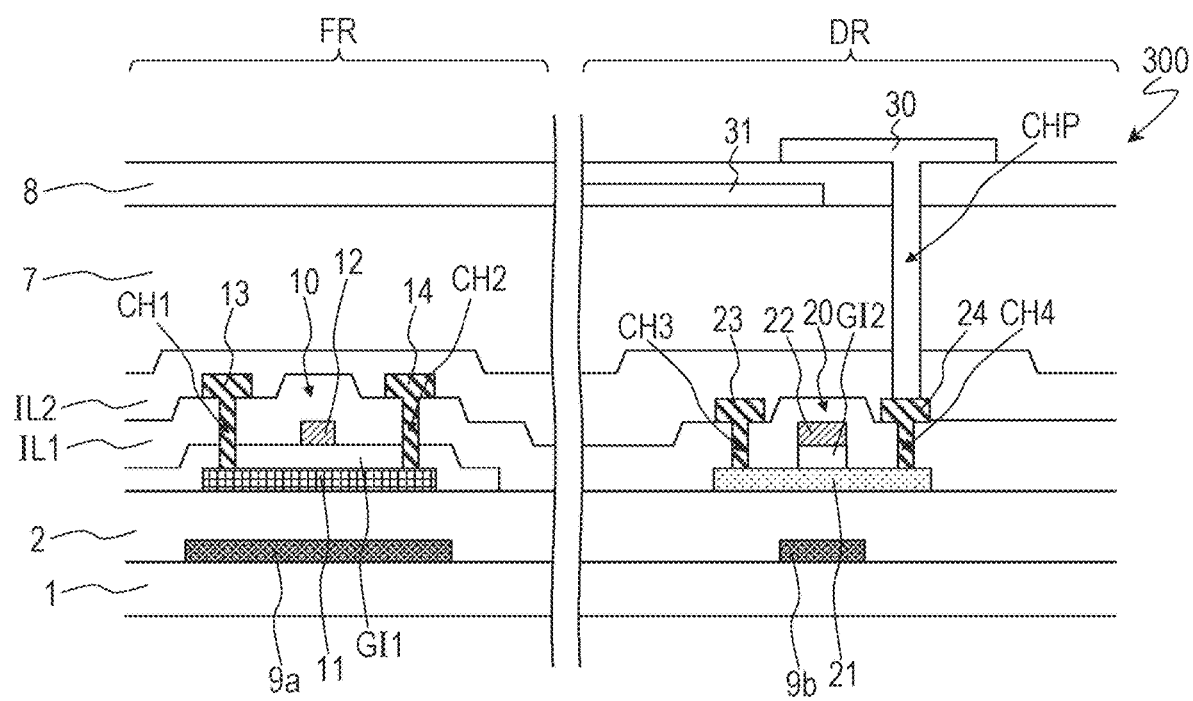
FIG. 14 is a schematic cross-sectional view of an active matrix substrate 300, according to an embodiment of the present invention.

An active matrix substrate 300, according to the present embodiment, will be described with reference to FIG. 14. FIG. 14 is a schematic cross-sectional view of the active matrix substrate 300.

The active matrix substrate 300 of the present embodiment is different from the active matrix substrates 100 and 200 of the first and second embodiments in the number of insulating layers stacked. In the active matrix substrate 300 of the present embodiment, as will be described later, a first gate insulating layer GI1, a second gate insulating layer GI2, a first insulating layer IL1, and a second insulating layer IL2 are provided between the base coat layer 2 and planarization layer 7. It is to be noted that the number of insulating layers stacked between the base coat layer 2 and the planarization layer 7 is three because the first gate insulating layer GI1 and the second gate insulating layer GI2 are formed from an identical insulating film. Furthermore, in the present embodiment, the first gate electrode 12 and the second gate electrode 22 are formed from an identical electrically conductive film (i.e., simultaneously, by patterning an identical electrically conductive film).

As illustrated in FIG. 14, the active matrix substrate 300 includes the first TFT 10 and the second TFT 20. The first TFT 10 is a circuit TFT and disposed in the peripheral region FR. The second TFT 20 is a pixel TFT and disposed in the display region DR.

The first TFT 10 is a crystalline silicon TFT including the crystalline silicon semiconductor layer 11, which is an active layer. The first TFT 10 includes a first gate insulating layer GI1, a first gate electrode 12, a first source electrode 13, and a first drain electrode 14, in addition to the crystalline silicon semiconductor layer 11.

The crystalline silicon semiconductor layer 11 is provided on the base coat layer 2. The first gate insulating layer GI1 is provided on the crystalline silicon semiconductor layer 11.

The first gate electrode 12 is provided on the first gate insulating layer GI1. The first gate electrode 12 faces the crystalline silicon semiconductor layer 11 with the first gate insulating layer GI1 disposed therebetween.

The first source electrode 13 and the first drain electrode 14 are electrically connected to the crystalline silicon semiconductor layer 11. In the present embodiment, the first insulating layer IL1 provided includes portions that cover the first gate insulating layer GI1 and the first gate electrode 12, and the first source electrode 13 and the first drain electrode 14 are provided on the first insulating layer IL1. The first source electrode 13 and the first drain electrode 14 are connected to the crystalline silicon semiconductor layer 11, respectively via a first contact hole CH1 and a second contact hole CH2, which are formed in the first insulating layer IL1 and the first gate insulating layer GI1.

The second TFT 20 is an oxide semiconductor TFT including the oxide semiconductor layer 21, which is an active layer. The second TFT 20 includes a second gate insulating layer GI2, a second gate electrode 22, a second source electrode 23, and a second drain electrode 24, in addition to the oxide semiconductor layer 21.

The oxide semiconductor layer 21 is provided on the base coat layer 2. The second gate insulating layer GI2 is provided on the oxide semiconductor layer 21. The second gate insulating layer GI2 is formed only on a region that overlaps the second gate electrode 22 and is in the form of an island.

The second gate electrode 22 is provided on the second gate insulating layer GI2. The second gate electrode 22 faces the oxide semiconductor layer 21 with the second gate insulating layer GI2 disposed therebetween.

The second source electrode 23 and the second drain electrode 24 are electrically connected to the oxide semiconductor layer 21. The first insulating layer IL1 includes a portion that covers the oxide semiconductor layer 21, the second gate insulating layer GI2, and the second gate electrode 22. The second source electrode 23 and the second drain electrode 24 are provided on the first insulating layer IL1. The second source electrode 23 and the second drain electrode 24 are connected to the oxide semiconductor layer 21, respectively via a third contact hole CH3 and a fourth contact hole CH4, which are formed in the first insulating layer IL1. The second gate electrode 22 does not overlap the second source electrode 23 or the second drain electrode 24 as viewed in a direction normal to the surface of the substrate.

The second insulating layer IL2 is provided on the first insulating layer IL1 to cover the first source electrode 13, the first drain electrode 14, the second source electrode 23, and the second drain electrode 24.

As described above, the first TFT 10 and the second TFT 20 each have a top-gate structure.

The planarization layer 7 is provided on the second insulating layer IL2, and the common electrode 31 is provided on the planarization layer 7. The dielectric layer 8 is provided to cover the common electrode 31, and the pixel electrode 30 is provided on the dielectric layer 8. The pixel electrode 30 is connected to the second drain electrode 24 via a pixel contact hole CHP, which is formed in the second insulating layer IL2, the planarization layer 7, and the dielectric layer 8.

The first light blocking layer 9a is provided below the crystalline silicon semiconductor layer 11. The first light blocking layer 9a overlaps the crystalline silicon semiconductor layer 11 as viewed in a direction normal to the surface of the substrate. Furthermore, the second light blocking layer 9b is provided below the oxide semiconductor layer 21. The second light blocking layer 9b overlaps the oxide semiconductor layer 21 as viewed in a direction normal to the surface of the substrate.

In the active matrix substrate 300 of the present embodiment, too, the first TFT 10 and the second TFT 20 each have a top-gate structure, and consequently the pixel TFT (second TFT 20) has improved current driving ability, while the reliability of the circuit TFT (first TFT 10) is prevented from decreasing and display quality is prevented from decreasing, as in the active matrix substrates 100 and 200 of the first and second embodiments.

Furthermore, with the active matrix substrate 300 of the present embodiment, in which the number of insulating layers stacked is even smaller than in the active matrix substrate 200 of the second embodiment, the number of manufacturing steps can be further reduced, thereby achieving a further reduction in manufacturing cost.

Note that in the active matrix substrate 300 of the present embodiment, too, in the case where the second light blocking layer 9b is formed of an electrically conductive material, the second light blocking layer 9b may be electrically connected to the second gate electrode 22, as in the active matrix substrate 100 of the first embodiment. In this case, the second light blocking layer 9b can serve as an additional gate electrode (back gate electrode) of the second TFT 20, and as a result, the on-state current of the second TFT 20 can be further increased, and therefore the current driving ability thereof can be further improved.

Next, an example of a method for manufacturing the active matrix substrate 300 will be described. FIG. 15 to FIG. 17 are cross-sectional views of a process, which illustrate a method for manufacturing the active matrix substrate 300.

Figure 15A:
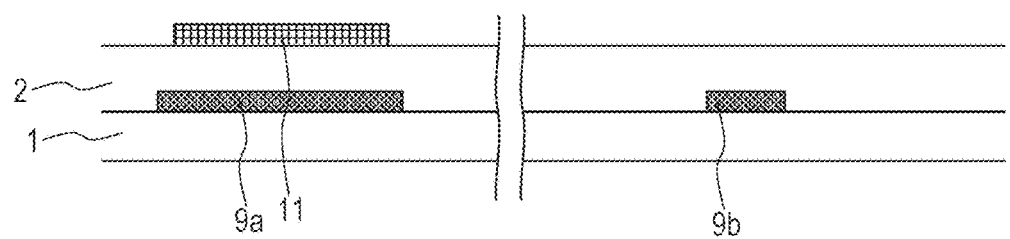
FIGS. 15(a) to 15(d) are cross-sectional views of a process, which illustrate a method for manufacturing the active matrix substrate 300.

First, as illustrated in FIG. 15(a), the first light blocking layer 9a, the second light blocking layer 9b, the base coat layer 2, and the crystalline silicon semiconductor layer 11 are formed successively on the substrate 1. These steps can be performed in a manner similar to that for the steps described above with reference to FIG. 5(a) to FIG. 5(c), regarding the active matrix substrate 100 of the first embodiment.

Figure 15B:
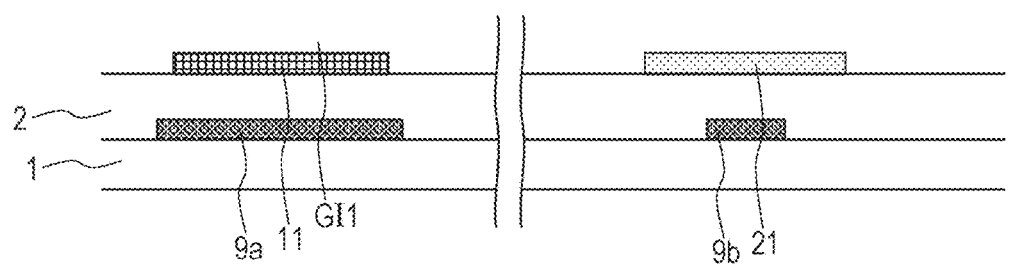

Next, as illustrated in FIG. 15(b), the oxide semiconductor layer 21 is formed on the base coat layer 2. Specifically, the oxide semiconductor layer 21 can be formed by depositing an oxide semiconductor film on the base coat layer 2 and thereafter patterning the oxide semiconductor film. The oxide semiconductor 21 has a thickness of 10 nm or greater and 150 nm or less, for example.

Figure 15C:
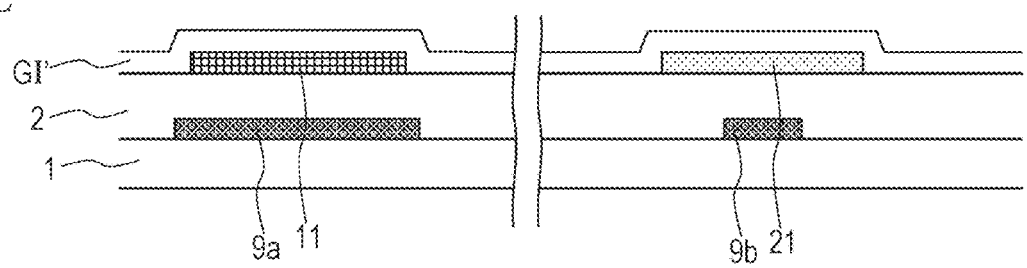

Subsequently, as illustrated in FIG. 15(c), an insulating film GI', from which the first gate insulating layer GI1 and the second gate insulating layer GI2 are formed, is formed to cover the base coat layer 2, the crystalline silicon semiconductor layer 11, and the oxide semiconductor layer 21. The insulating film GI' is a silicon oxide (SiOx) film, for example. The insulating film GI' has a thickness of 80 nm or greater and 250 nm or less, for example.

Figure 15D:
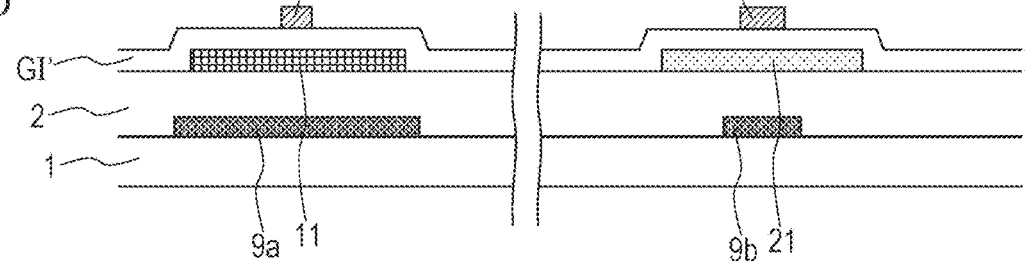

Thereafter, as illustrated in FIG. 15(d), the first gate electrode 12 is formed on the insulating film GI' to face the crystalline silicon semiconductor layer 11 with the insulating film GI' disposed therebetween, and the second gate electrode 22 is formed on the insulating film GI' to face the oxide semiconductor layer 21 with the insulating film GI' disposed therebetween. Specifically, the first gate electrode 12 and the second gate electrode 22 can be formed by depositing an electrically conductive film for the gate on the insulating film GI' and thereafter patterning the electrically conductive film for the gate. Examples of materials for the electrically conductive film for the gate include metals, such as molybdenum (Mo), tungsten (W), aluminum (Al), copper (Cu), titanium (Ti), and tantalum (Ta), and alloys thereof. The first gate electrode 12 and the second gate electrode 22 may each have a multilayer structure including a plurality of layers formed of different electrically conductive materials. The first gate electrode 12 and the second gate electrode 22 each have a thickness of 30 nm or greater and 500 nm or less, for example.

Next, the source region and the drain region are formed by implanting an impurity into the crystalline silicon semiconductor layer 11 with the first gate electrode 12 used as a mask. In the crystalline silicon semiconductor layer 11, the region in which no impurities are implanted forms the channel region (active region).

Figure 16A:
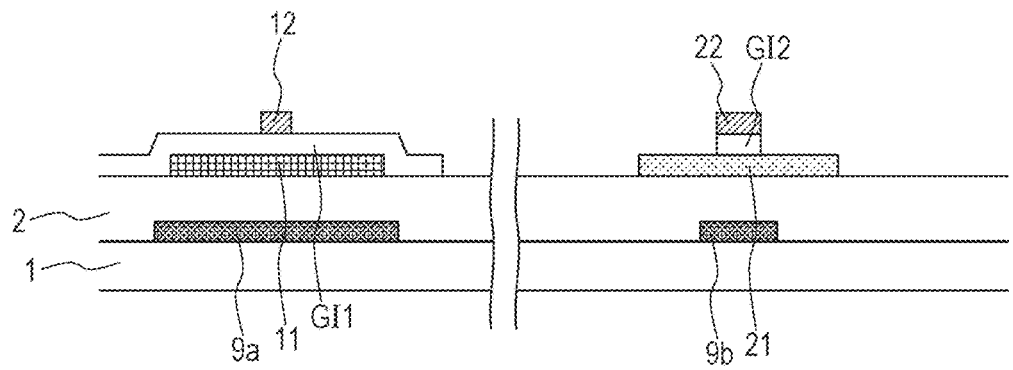
FIGS. 16(a) to 16(c) are cross-sectional views of the process, which illustrate the method for manufacturing the active matrix substrate 300.

Subsequently, as illustrated in FIG. 16(a), the insulating film GI' is patterned to form the first gate insulating layer GI1 and the second gate insulating layer GI2. For example, a resist mask is used to form the first gate insulating layer GI1, and the second gate electrode 22 is used as a mask to form the second gate insulating layer GI2.

Figure 16B:
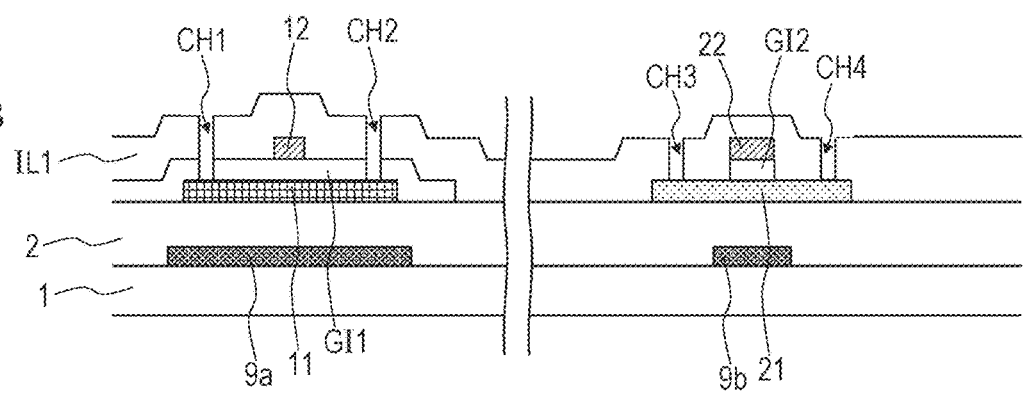

Thereafter, as illustrated in FIG. 16(b), the first insulating layer IL1 is formed to cover the first gate electrode 12, the second gate electrode 22, the oxide semiconductor layer 21, and the like. The first insulating layer IL1 is, for example, a silicon oxide (SiOx) layer, a silicon nitride (SiNx) layer, or a silicon oxynitride (SiNxOy) layer. The first insulating layer IL1 may have a multilayer structure in which two or more of these layers are stacked together. The first insulating layer IL1 has a thickness of 150 nm or greater and 500 nm or less, for example. Thereafter, the first contact hole CH1 and the second contact hole CH2 are formed in the first insulating layer IL1 and the first gate insulating layer GI1 to expose portions (the source region and the drain region) of the crystalline silicon semiconductor layer 11. Furthermore, the third contact hole CH3 and the fourth contact hole CH4 are formed in the first insulating layer IL1 to expose portions (the source contact region and the drain contact region) of the oxide semiconductor layer 21.

Figure 16C:
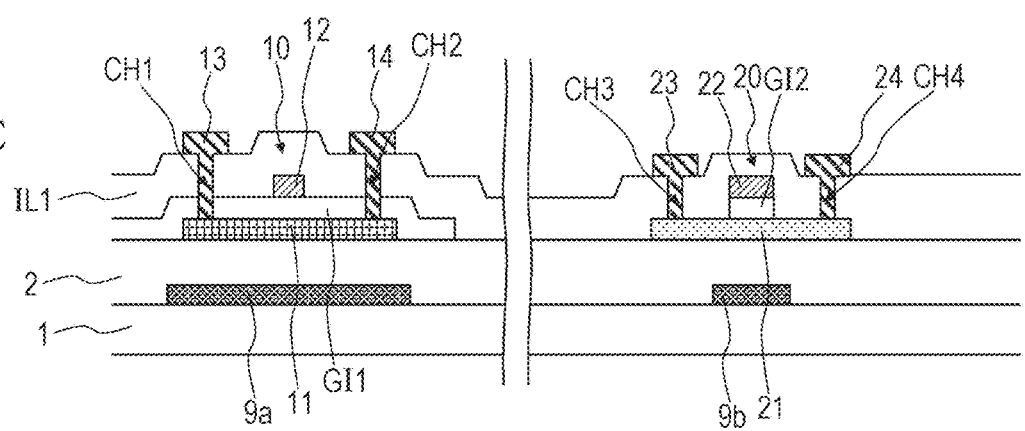

Next, as illustrated in FIG. 16(c), the first source electrode 13, the first drain electrode 14, the second source electrode 23, and the second drain electrode 24 are formed on the first insulating layer IL1. Specifically, the first source electrode 13, the first drain electrode 14, the second source electrode 23, and the second drain electrode 24 can be formed by depositing, on the first insulating layer IL1, an electrically conductive film for the source and drain and thereafter patterning the electrically conductive film for the source and drain. Examples of materials for the electrically conductive film for the source and drain include metals, such as molybdenum (Mo), tungsten (W), aluminum (Al), copper (Cu), titanium (Ti), and tantalum (Ta), and alloys thereof. The first source electrode 13, the first drain electrode 14, the second source electrode 23, and the second drain electrode 24 each have a thickness of 100 nm or greater and 500 nm or less, for example.

Figure 17A:
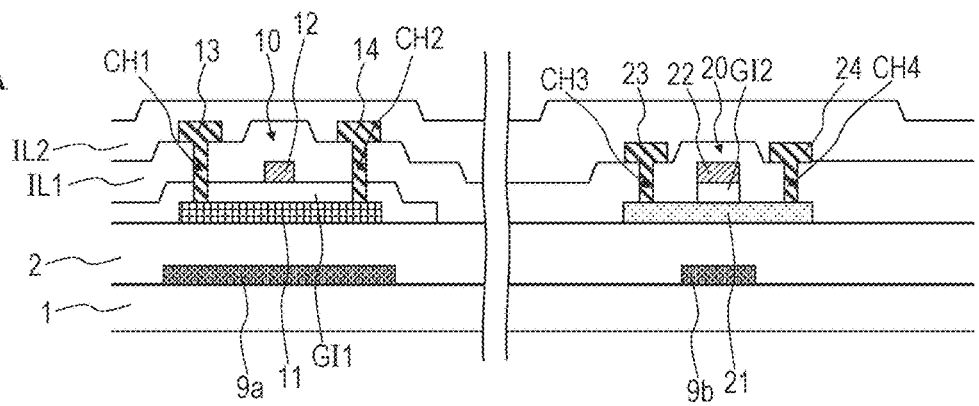
FIGS. 17(a) and 17(b) are cross-sectional views of the process which illustrate the method for manufacturing the active matrix substrate 300.

Subsequently, as illustrated in FIG. 17(a), the second insulating layer IL2 is formed to cover the first insulating layer IL1, the first source electrode 13, the first drain electrode 14, the second source electrode 23, and the second drain electrode 24. The second insulating layer IL2 is a silicon nitride (SiNx) layer, for example. The second insulating layer IL2 has a thickness of 100 nm or greater and 500 nm or less, for example. Note that the second insulating layer IL2 may be omitted.

Figure 17B:
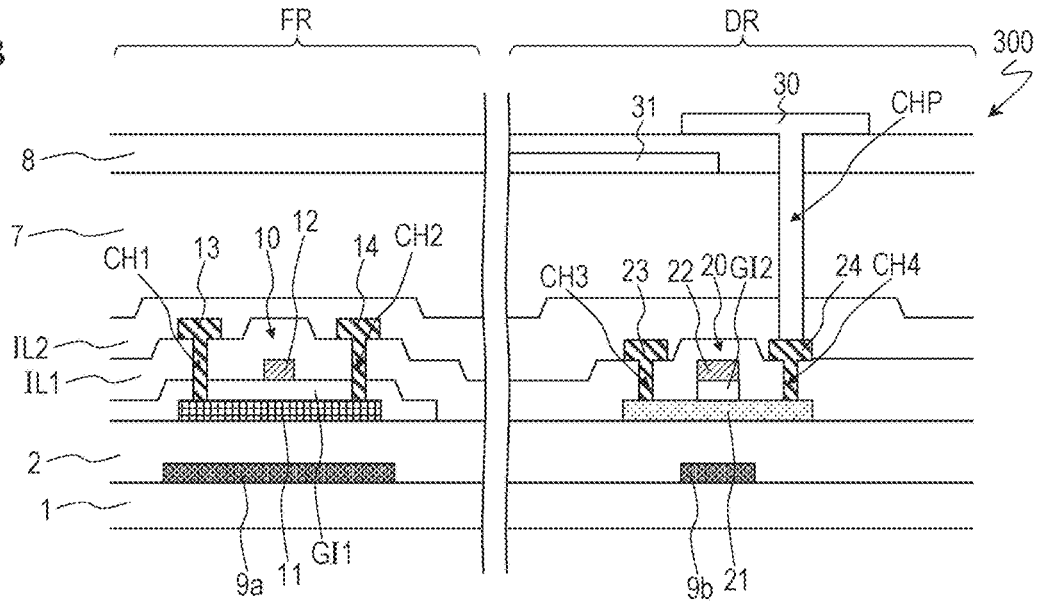

Thereafter, as illustrated in FIG. 17(b), the planarization layer 7, the common electrode 31, the dielectric layer 8, and the pixel electrode 30 are formed successively on the second insulating layer IL2. These steps can be performed in a manner similar to that for the steps described above with reference to FIG. 8(a) to FIG. 9(b), regarding the active matrix substrate 100 of the first embodiment. In the manner described above, the active matrix substrate 300 can be obtained.

Fourth Embodiment

Figure 18:
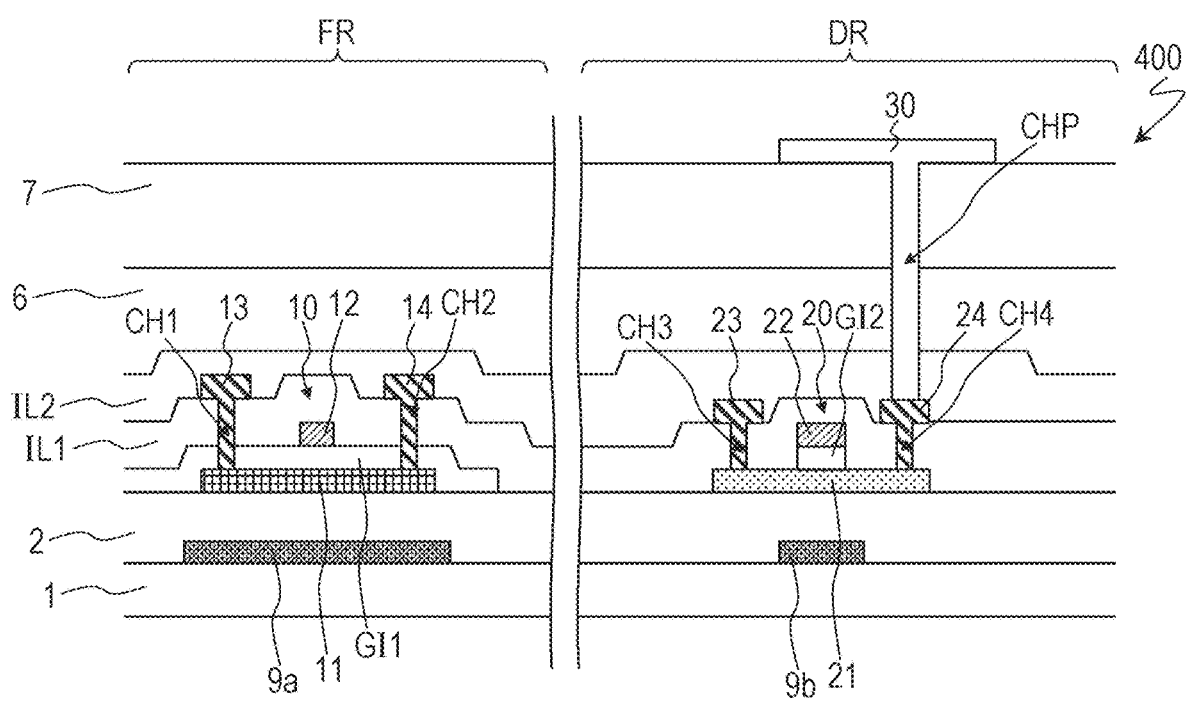
FIG. 18 is a schematic cross-sectional view of an active matrix substrate 400, according to an embodiment of the present invention.

An active matrix substrate 400, according to the present embodiment, will be described with reference to FIG. 18. FIG. 18 is a schematic cross-sectional view of the active matrix substrate 400.

The active matrix substrate 400 of the present embodiment is used in bottom-emission type organic EL (electroluminescence) display devices and, in this regard, is different from the active matrix substrate 300 of the third embodiment. The description below mainly describes features of the active matrix substrate 400 that are different from those of the active matrix substrate 300 of the third embodiment.

The configurations of the first TFT 10 and the second TFT 20 included in the active matrix substrate 400 are substantially the same as those of the first TFT 10 and the second TFT 20 included in the active matrix substrate of the third embodiment.

In the active matrix substrate 400, a color filter layer 6 is provided on the second insulating layer IL2, and the planarization layer 7 is provided on the color filter layer 6. The pixel electrode 30 is provided on the planarization layer 7. The pixel electrode 30 is connected to the second drain electrode 24 of the second TFT 20 via the pixel contact hole CHP, which is formed in the planarization layer 7 and the color filter layer 6.

In the active matrix substrate 400 of the present embodiment, too, the first TFT 10 and the second TFT 20 each have a top-gate structure, and consequently the pixel TFT (second TFT 20) has improved current driving ability, while the reliability of the circuit TFT (first TFT 10) is prevented from decreasing and display quality is prevented from decreasing, as in the active matrix substrate 100 of the first embodiment.

Note that in the active matrix substrate 400 of the present embodiment, too, in the case where the second light blocking layer 9b is formed of an electrically conductive material, the second light blocking layer 9b may be electrically connected to the second gate electrode 22, as in the active matrix substrate 100 of the first embodiment. In this case, the second light blocking layer 9b can serve as an additional gate electrode (back gate electrode) of the second TFT 20, and as a result, the on-state current of the second TFT 20 can be further increased, and therefore the current driving ability thereof can be further improved.

Furthermore, in the active matrix substrate 400 for organic EL display devices, the first light blocking layer 9a and the second light blocking layer 9b may be omitted.

Figure 19A:
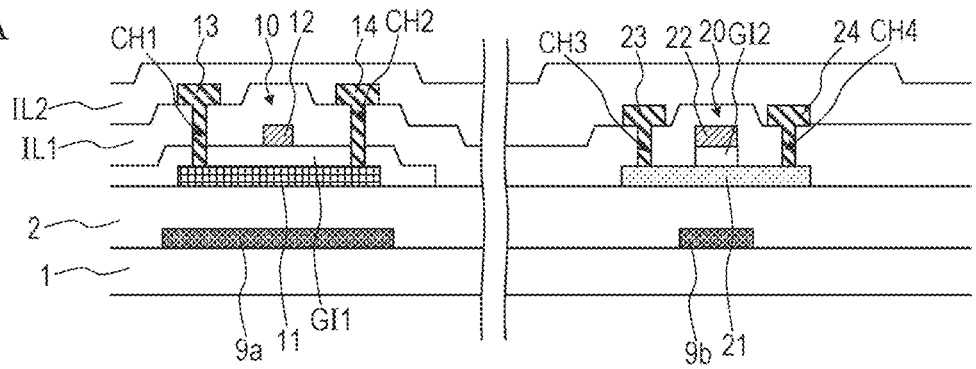
FIGS. 19(a) to 19(c) are cross-sectional views of a process, which illustrate a method for manufacturing the active matrix substrate 400.
Figure 19B:
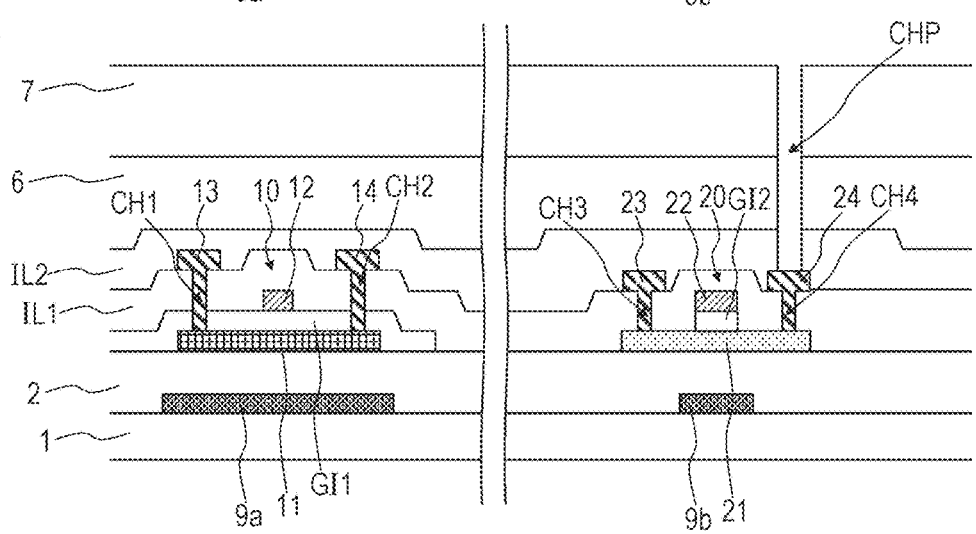
Figure 19C:
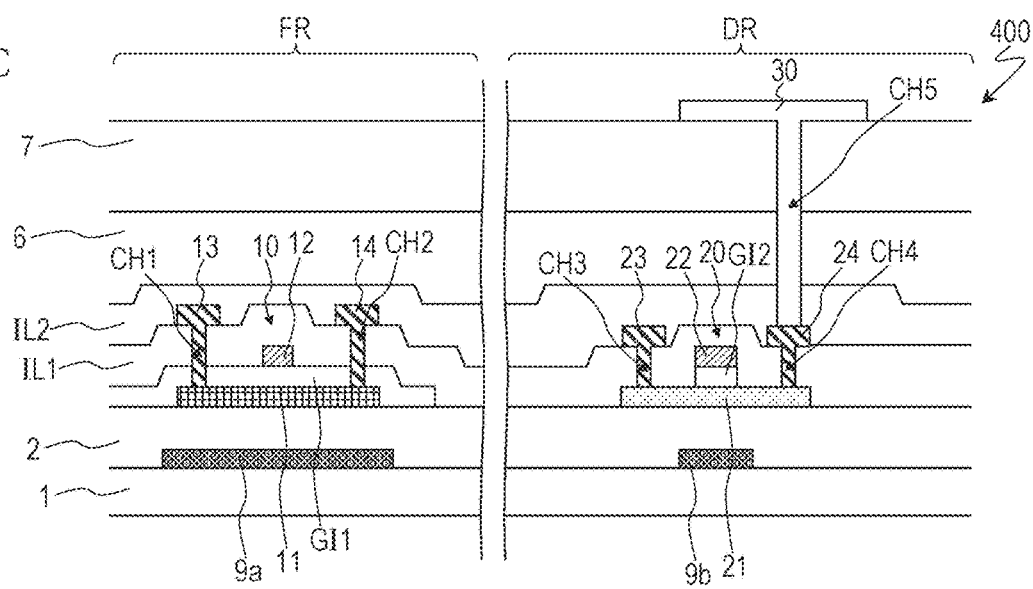

Next, an example of a method for manufacturing the active matrix substrate 400 will be described. FIGS. 19(a), 19(b), and 19(c) are cross-sectional views of a process, which illustrate a method for manufacturing the active matrix substrate 400.

First, as illustrated in FIG. 19(a), the layers are formed on the substrate 1 successively, from the first light blocking layer 9a to the second insulating layer IL2. These steps can be performed in a manner similar to that for the steps described above with reference to FIG. 15(a) to FIG. 17(a), regarding the active matrix substrate 300 of the third embodiment.

Next, as illustrated in FIG. 19(b), the color filter layer 6 and the planarization layer 7 are formed successively on the second insulating layer IL2. The color filter layer 6 is formed from a colored photosensitive resin material, for example. The planarization layer 7 is formed from a photosensitive resin material, for example. The pixel contact hole CHP is formed in the planarization layer 7, the color filter layer 6, and the second insulating layer IL2 to expose the second drain electrode 24.

Thereafter, as illustrated in FIG. 19(c), the pixel electrode 30 is formed on the planarization layer 7. Specifically, the pixel electrode 30 can be formed by depositing an electrically conductive film and thereafter patterning the electrically conductive film. The pixel electrode 30 is an ITO layer, for example. In addition, an organic EL layer and a reflective electrode (common electrode), which are not illustrated, are stacked together on the pixel electrode 30. The reflective electrode has a structure in which, for example, an ITO layer, silver (Ag) layer, and an ITO layer are stacked together. The pixels are separated from one another by a bank layer, which is in the form of a bank. In the manner described above, the active matrix substrate 400 can be obtained.

Figure 20:
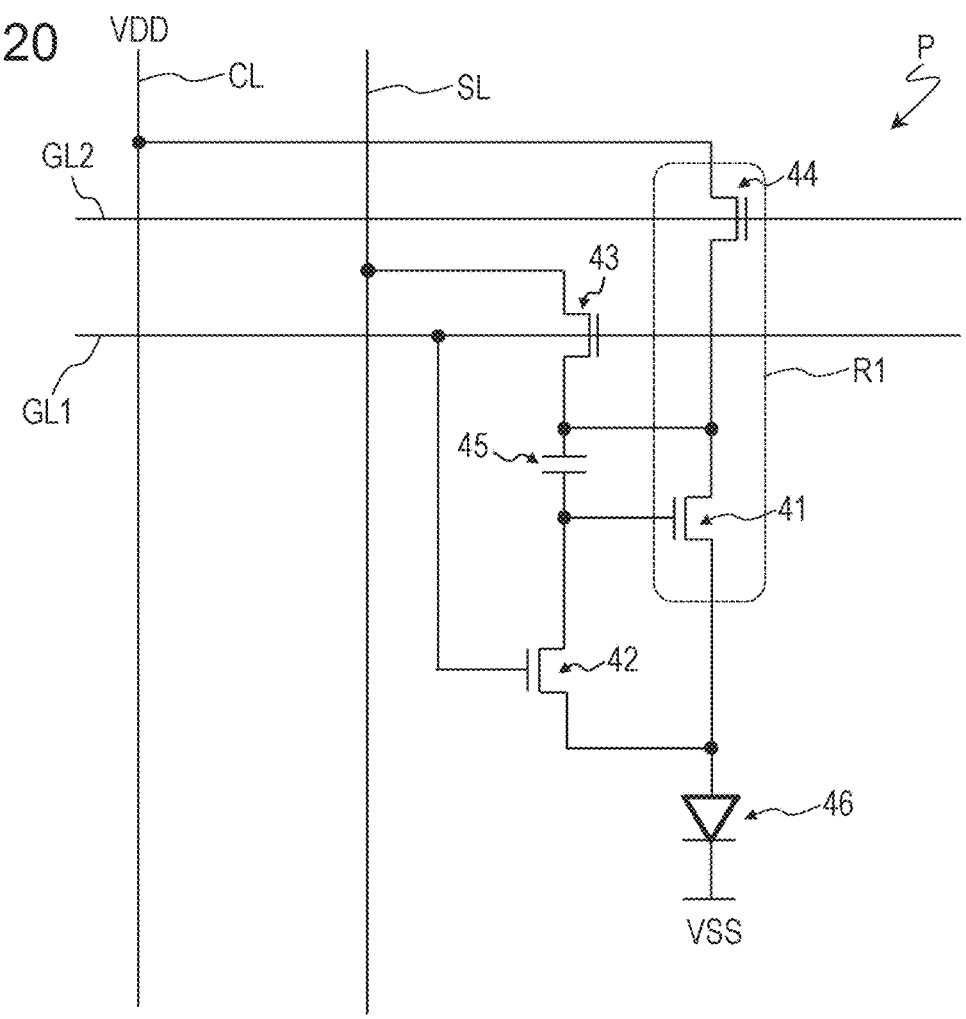
FIG. 20 is a diagram illustrating an example of an equivalent circuit for a pixel region P of the active matrix substrate 400.

In the active matrix substrate 400 for organic EL display devices, two or more TFTs may be disposed in each of the pixel regions P. FIG. 20 illustrates an example of an equivalent circuit for a pixel region P of the active matrix substrate 400.

In the example illustrated in FIG. 20, the pixel region P includes a driver TFT 41, a selection TFT 42, a first current switching TFT 43, a second current switching TFT 44, a capacitor 45, and an OLED (organic light emitting diode) 46.

The gate electrode of the driver TFT 41 is connected to the source electrode of the selection TFT 42 and to one of the pair of electrodes that form the capacitor 45 (first electrode). The source electrode of the driver TFT 41 is connected to the drain electrodes of the first and second current switching TFTs 43 and 44. The drain electrode of the driver TFT 41 is connected to the drain electrode of the selection TFT 42 and to an anode electrode of the OLED 46.

The gate electrode of the selection TFT 42 is connected to a first gate bus line GL1. The source electrode of the selection TFT 42 is connected to the gate electrode of the driver TFT 41. The drain electrode of the selection TFT 42 is connected to the drain electrode of the driver TFT 41.

The gate electrode of the first current switching TFT 43 is connected to the first gate bus line GL1. The source electrode of the first current switching TFT 43 is connected to the source bus line SL. The drain electrode of the first current switching TFT 43 is connected to the source electrode of the driver TFT 41 and to the other of the pair of electrodes that form the capacitor 45 (second electrode).

The gate electrode of the second current switching TFT 44 is connected to a second gate bus line GL2. The source electrode of the second current switching TFT 44 is connected to a current supply line CL. The current supply line CL is connected to a positive power supply VDD. The drain electrode of the second current switching TFT 44 is connected to the source electrode of the driver TFT 41.

The OLED 46 includes the anode electrode connected to the drain electrode of the driver TFT 41, an organic EL layer formed on the anode electrode, and a cathode electrode formed on the organic EL layer. For example, the organic EL layer has a multilayer structure including a hole transport layer, an organic light emitting layer, and an electron transport layer or a multilayer structure including a hole injection layer, a hole transport layer, an organic light emitting layer, an electron transport layer, and an electron injection layer. The organic EL layer may further include a layer for improving the luminous efficiency, life, and the like of the organic light emitting layer. The cathode electrode is connected to a negative power supply VSS.

The pixel circuit illustrated in FIG. 20 operates as follows.

First, when the selection TFT 42 and the first current switching TFT 43 are selected via the first gate bus line GL1 and placed in an ON state, the driver TFT 41 is placed in a state in which the gate electrode and drain electrode thereof are connected to each other, that is, diode-connected to each other. Accordingly, a voltage corresponding to a data current $I_{DATA}$, which is supplied from the source bus line SL, is charged into the capacitor 45.

Next, when the selection TFT 42 and the first current switching TFT 43 are placed in an OFF state, and the second current switching TFT 44 is selected via the second gate bus line GL2 and placed in an ON state, a current from the current supply line CL is supplied to the OLED 46 via the second current switching TFT 44 and the driver TFT 41 (which is in an ON state due to the voltage charged in the capacitor 45), and thus, the OLED 46 emits light.

The driver TFT 41 in the configuration exemplified in FIG. 20 corresponds to the second TFT 20 illustrated in FIG. 18. That is, the driver TFT 41 is an oxide semiconductor TFT. The selection TFT 42, the first current switching TFT 43, and the second current switching TFT 44 may be oxide semiconductor TFTs or may be crystalline silicon TFTs (hereinafter referred to as "third TFTs") including, as an active layer, a crystalline silicon semiconductor layer formed from the same semiconductor film from which the crystalline silicon semiconductor layer 11 of the first TFT 10 is formed.

In the case where the second TFT 20, which is an oxide semiconductor TFT, and the third TFT, which is a crystalline silicon TFT, coexist in each of the pixel regions P, high definition is advantageously achieved when both the second TFT 20 and the third TFT have a top-gate structure. This will be described below.

Figure 21:
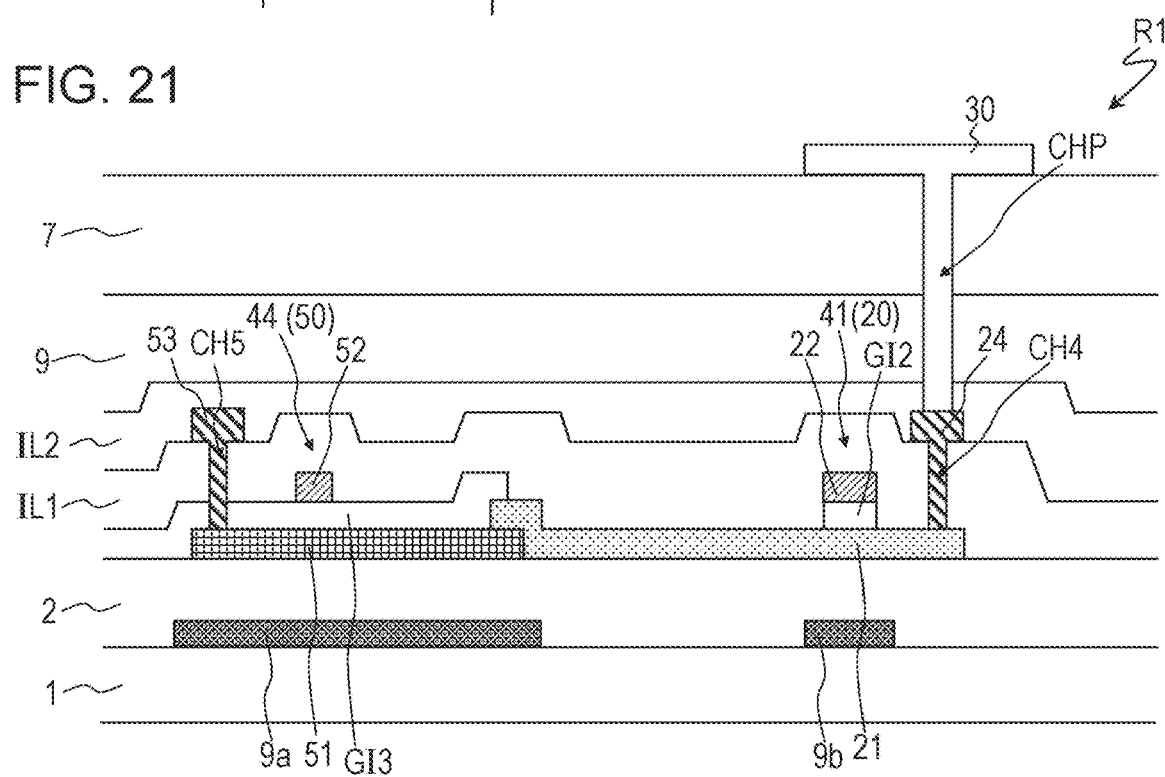
FIG. 21 is a cross-sectional view of a region R1, which is illustrated in FIG. 20, the region R1 including a driver TFT 41 and a second current switching TFT 44.

FIG. 21 is a cross-sectional view of a region R1 illustrated in FIG. 20, the region R1 including a driver TFT 41 and a second current switching TFT 44.

The driver TFT 41 (second TFT 20) is an oxide semiconductor TFT including the oxide semiconductor layer 21. On the other hand, the second current switching TFT 44 (third TFT 50) is a crystalline silicon TFT including a crystalline silicon semiconductor layer 51.

The crystalline silicon semiconductor layer 51 of the third TFT 50 is provided on the base coat layer 2. A gate insulating layer (third gate insulating layer) GI3 of the third TFT 50 is provided on the crystalline silicon semiconductor layer 51.

A gate electrode (third gate electrode) 52 of the third TFT 50 is provided on the third gate insulating layer GI3. The third gate electrode 52 faces the crystalline silicon semiconductor layer 51 with the third gate insulating layer GI3 disposed therebetween.

A source electrode (third source electrode) 53 of the third TFT 50 is electrically connected to the crystalline silicon semiconductor layer 51. The third source electrode 53 is provided on the first insulating layer IL1. The third source electrode 53 is connected to the crystalline silicon semiconductor layer 51 via a fifth contact hole CH5, which is formed in the first insulating layer IL1 and the third gate insulating layer GI3.

In the exemplified configuration, the third TFT 50 has no drain electrode formed from the same electrically conductive film from which the third source electrode 53 is formed. Furthermore, the second TFT 20 has no source electrode formed from the same electrically conductive film from which the second drain electrode 24 is formed. The oxide semiconductor layer 21 of the second TFT 20 extends and comes into contact with the crystalline silicon semiconductor layer 51 of the third TFT 50, and thus, the drain of the third TFT 50 is connected to the source of the second TFT 20.

Figure 22:
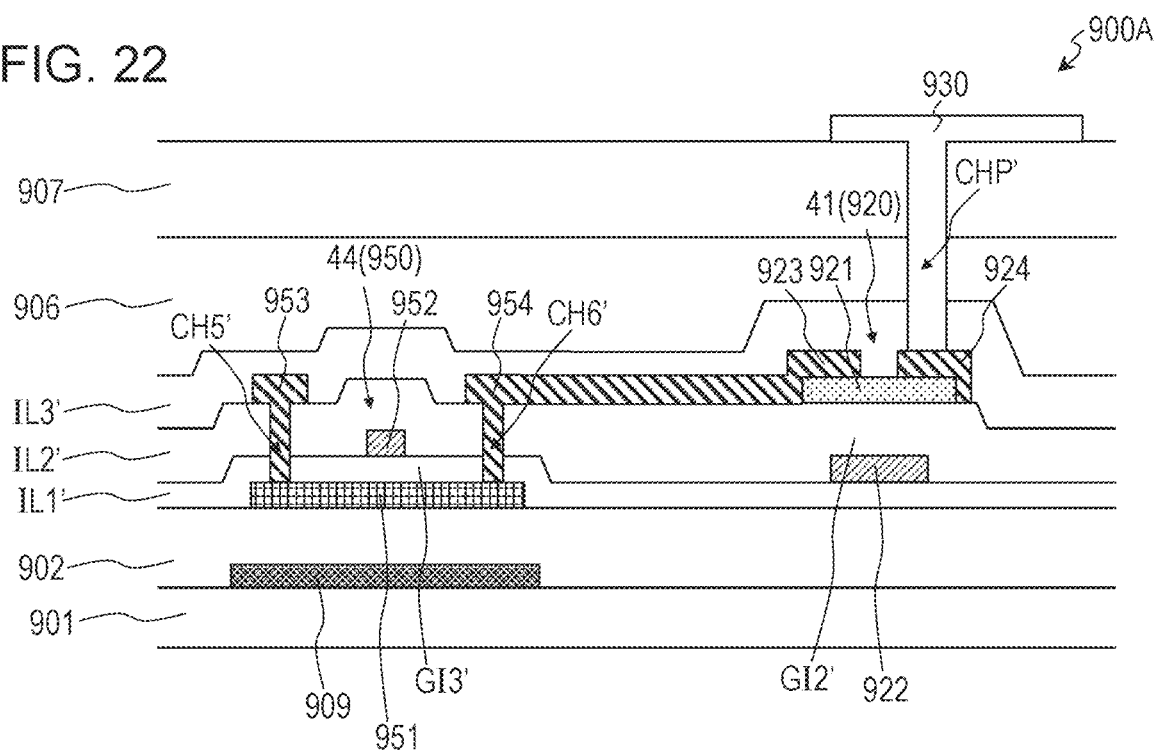
FIG. 22 is a cross-sectional view of a region of an active matrix substrate 900A of Comparative Example 2, the region corresponding to the region R1.

FIG. 22 is a cross-sectional view of a region of an active matrix substrate 900A of Comparative Example 2, the region corresponding to the region R1.

The active matrix substrate 900A of Comparative Example 2 is for use in organic EL display devices and, in this regard, is different from the active matrix substrate 900 of Comparative Example 1, which is illustrated in FIG. 4. In the active matrix substrate 900A of Comparative Example 2, a color filter layer 906 is provided on the third insulating layer IL3', and the planarization layer 907 is provided on the color filter layer 906. The pixel electrode 930 is provided on the planarization layer 907. The pixel electrode 930 is connected to the drain electrode 924 of the second TFT 920 (driver TFT 41) via a pixel contact hole CHP', which is formed in the planarization layer 907 and the color filter layer 906.

The second current switching TFT 44 (third TFT 950) is a crystalline silicon TFT including a crystalline silicon semiconductor layer 951.

The crystalline silicon semiconductor layer 951 of the third TFT 950 is provided on the base coat layer 902. A portion of the first insulating layer IL1', which is a portion that covers the crystalline silicon semiconductor layer 951, serves as a gate insulating layer (third gate insulating layer) GI3' of the third TFT 950.

A gate electrode (third gate electrode) 952 of the third TFT 950 is provided on the third gate insulating layer GI3' and faces the crystalline silicon semiconductor layer 951 with the third gate insulating layer GI3' disposed therebetween.

A source electrode (third source electrode) 953 of the third TFT 950 and a drain electrode (third drain electrode) 954 thereof are provided on the second insulating layer IL2'. The third source electrode 953 and the third drain electrode 954 are connected to the crystalline silicon semiconductor layer 951 via a fifth contact hole CH5' and a sixth contact hole CH6', which are formed in the third gate insulating layer GI3' and the second insulating layer IL2'.

The third drain electrode 954 of the third TFT 950 is continuous with the second source electrode 923 of the second TFT 920, and thus, the drain of the third TFT 950 is connected to the source of the second TFT 920.

Figure 23A:
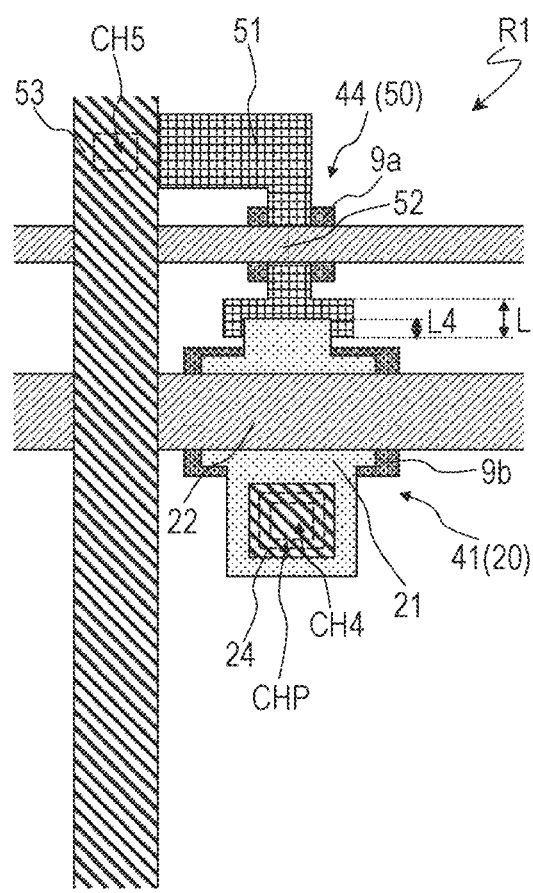
FIG. 23(a) is a plan view of the region R1 illustrated in FIG. 20.
Figure 23B:
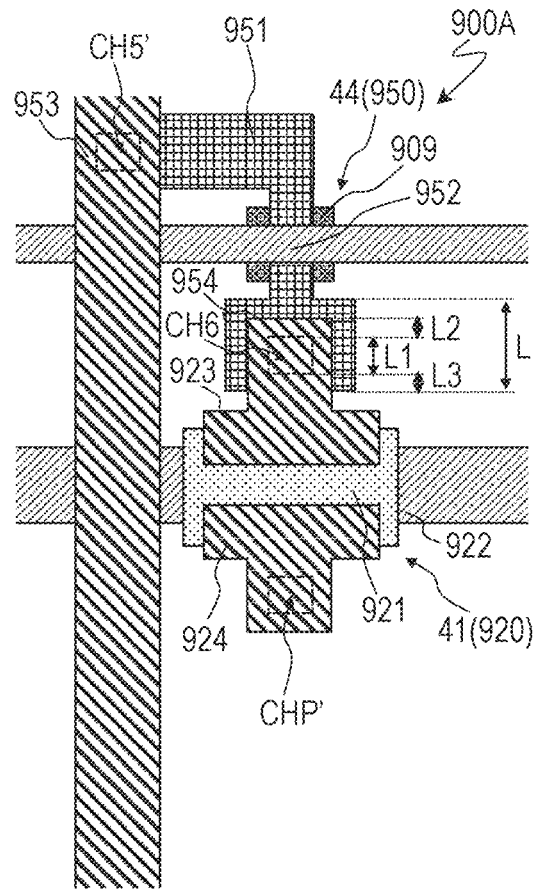
FIG. 23(b) is a plan view of the region of the active matrix substrate 900A of Comparative Example 2, the region corresponding to the region R1.

In the configuration illustrated in FIG. 21, the sixth contact hole CH6', which is included in the active matrix substrate 900A of Comparative Example 2 illustrated in FIG. 22, is not required, and therefore, the region for connecting the driver TFT 41 to the second current switching TFT 44 (hereinafter referred to as a "connection region") can be reduced in size. More detailed descriptions will be given below with reference also to FIGS. 23(*a*) and 23(*b*). FIG. 23(*a*) is a plan view of the region R1 illustrated in FIG. 20, and FIG. 23(*b*) is a plan view of a region of the active matrix substrate 900A of Comparative Example 2, the region corresponding to the region R1.

As can be seen from FIG. 22 and FIG. 23(*b*), in the active matrix substrate 900A of Comparative Example 2, it is necessary that the sixth contact hole CH6', the crystalline silicon semiconductor layer 951 of the third TFT 950, and the drain electrode 954 thereof overlap one another in the connection region. Accordingly, in consideration of alignment accuracy and the like, it is necessary that a length L of the connection region include a length L1 of the sixth contact hole CH6' (e.g., 4 μm), and, in addition, a distance L2 from an edge of the drain electrode 954 to an edge of the sixth contact hole CH6' (e.g., 3 μm) and a distance L3 from an edge of the sixth contact hole CH6' to an edge of the crystalline silicon semiconductor layer 951 (e.g., 2 μm).

In contrast, in the configuration illustrated in FIG. 21 and FIG. 23(*a*), it is sufficient that the crystalline silicon semiconductor layer 51 and the oxide semiconductor layer 21 overlap each other in the connection region. Accordingly, it is sufficient that the length L of the connection region include a distance L4 from an edge of the oxide semiconductor layer 21 to an edge of the crystalline silicon semiconductor layer 51 (e.g., 3 μm). As such, in the configuration illustrated in FIG. 21 and FIG. 23(*a*), the length L of the connection region can be smaller than in the active matrix substrate 900A of Comparative Example 2, and therefore, high definition is advantageously achieved.

(Oxide Semiconductor)

The oxide semiconductor included in the oxide semiconductor layer 21 may be an amorphous oxide semiconductor or a crystalline oxide semiconductor, which has a crystalline portion. The crystalline oxide semiconductor may be a polycrystalline oxide semiconductor, a microcrystalline oxide semiconductor, or a crystalline oxide semiconductor in which the c-axis is oriented substantially perpendicular to the plane of the layer.

As described above, in the case where the second light blocking layer 9*b* serves as a back gate electrode of the second TFT 20, it is preferable that the oxide semiconductor layer 21 not have a multilayer structure (be a single layer).

In the case where the second light blocking layer 9*b* does not serve as a back gate electrode of the second TFT 20 (i.e., the second light blocking layer 9*b* is not electrically connected to the second gate electrode 22), the oxide semiconductor layer 21 may have a multilayer structure including two or more layers. In the case where the oxide semiconductor layer 21 has a multilayer structure, the oxide semiconductor layer 21 may include an amorphous oxide semiconductor layer and a crystalline oxide semiconductor layer, may include a plurality of crystalline oxide semiconductor layers having different crystal structures, or may include a plurality of amorphous oxide semiconductor layers. In the case where the oxide semiconductor layer 21 has a two-layer structure including an upper layer and a lower layer, it is preferable that the energy gap of the oxide semiconductor included in the upper layer be smaller than the energy gap of the oxide semiconductor included in the lower layer. However, in the case where the difference between the energy gaps of the layers is relatively small, the energy gap of the oxide semiconductor of the lower layer may be smaller than the energy gap of the oxide semiconductor of the upper layer.

Materials, structures, film forming methods, configurations of the oxide semiconductor layer having a multilayer structure, and the like for the amorphous oxide semiconductors and the above-mentioned crystalline oxide semiconductors are described in, for example, Japanese Unexamined Patent Application Publication No. 2014-007399. The entire disclosure of Japanese Unexamined Patent Application Publication No. 2014-007399 is incorporated herein by reference.

The oxide semiconductor layer 21 may include at least one metal element selected from among In, Ga, and Zn, for example. In embodiments of the present invention, the oxide semiconductor layer 21 includes an In—Ga—Zn—O system semiconductor (e.g., indium gallium zinc oxide), for example. Here, the In—Ga—Zn—O system semiconductor is a ternary oxide of In (indium), Ga (gallium), and Zn (zinc). The ratio (composition ratio) between In, Ga, and Zn is not particularly limited and may be, for example, In:Ga:Zn=2:2:1, In:Ga:Zn=1:1:1, In:Ga:Zn=1:1:2, or the like. Such an oxide semiconductor layer 21 can be formed from an oxide semiconductor film including an In—Ga—Zn—O system semiconductor.

The In—Ga—Zn—O system semiconductor may be amorphous or crystalline. For the crystalline In—Ga—Zn—O system semiconductor, crystalline In—Ga—Zn—O system semiconductors in which the c-axis is oriented substantially perpendicular to the plane of the layer are preferable.

Note that crystal structures for the crystalline In—Ga—Zn—O system semiconductor are disclosed in, for example, Japanese Unexamined Patent Application Publication No. 2014-007399, which is described above, Japanese Unexamined Patent Application Publication No. 2012-134475, Japanese Unexamined Patent Application Publication No. 2014-209727, and the like. The entire disclosures of Japanese Unexamined Patent Application Publication No. 2012-134475 and Japanese Unexamined Patent Application Publication No. 2014-209727 are incorporated herein by reference. TFTs including an In—Ga—Zn—O system semiconductor layer have a high mobility (more than 20 times higher than that of a-SiTFTs) and a low leakage current (less than one-hundredth of that of a-SiTFTs) and are therefore suitable for use as a driver TFT (e.g., a TFT included in a drive circuit provided around the display region that includes a plurality of pixels and on the same substrate on which the display region is provided) and for use as a pixel TFT (a TFT provided for the pixel).

The oxide semiconductor layer 21 may include a different oxide semiconductor, instead of an In—Ga—Zn—O system semiconductor. For example, an In—Sn—Zn—O system semiconductor (e.g., $In_2O_3$—$SnO_2$—$ZnO$; InSnZnO) may be included. The In—Sn—Zn—O system semiconductor is a ternary oxide of In (indium), Sn (tin), and Zn (zinc). Alternatively, the oxide semiconductor layer 21 may include an In—Al—Zn—O system semiconductor, an In—Al—Sn—Zn—O system semiconductor, a Zn—O system semiconductor, an In—Zn—O system semiconductor, a Zn—Ti—O system semiconductor, a Cd—Ge—O system semiconductor, a Cd—Pb—O system semiconductor, CdO (cadmium oxide), a Mg—Zn—O system semiconductor, an In—Ga—Sn—O system semiconductor, an In—Ga—O system semiconductor, a Zr—In—Zn—O system semiconductor, a Hf—In—Zn—O system semiconductor, or the like.

(Peripheral Circuit)

Examples of peripheral circuits provided in the peripheral region FR will be described with reference to FIG. 24.

Figure 24:
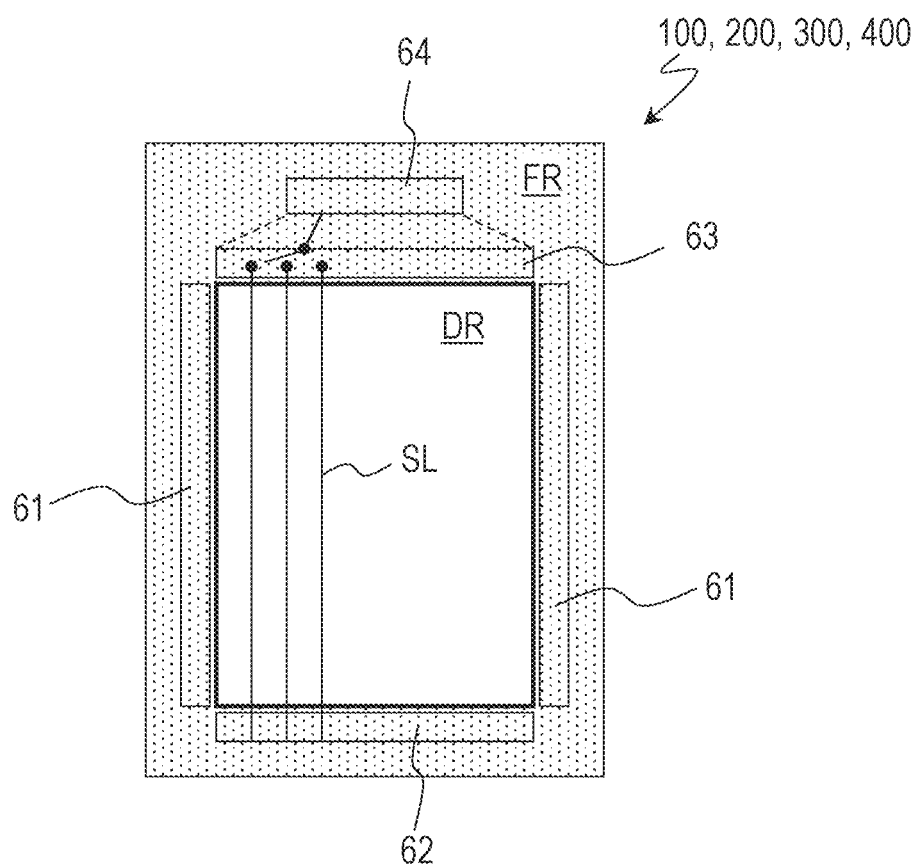
FIG. 24 is a diagram illustrating examples of peripheral circuits included in the active matrix substrates 100, 200, 300, and 400.

In the example illustrated in FIG. 24, a gate driver circuit 61, a check circuit 62, and a source shared driving (SSD) circuit 63 are provided in the peripheral region FR. The gate bus lines (not illustrated) are connected to terminals of the gate driver circuit. The source bus lines SL are connected to terminals of a driver IC 64 of a source driver via the SSD circuit 63. The SSD circuit 63 distributes video data to the plurality of (in this case, three) source bus lines SL from one video signal line (signal output line), which is connected to each of the terminals of the driver IC 64.

The first TFT 10, which is included in the active matrix substrates 100, 200, 300, and 400 of embodiments of the present invention, can form the gate driver circuit 61, the check circuit 62, and/or the source shared driving (SSD) circuit 63.

(Display Device)

Active matrix substrates of embodiments of the present invention are suitable for use in display devices, for example, in liquid crystal display devices and organic EL display devices. The liquid crystal display device can include an active matrix substrate of an embodiment of the present invention, a counter substrate disposed to face the active matrix substrate, and a liquid crystal layer provided between the active matrix substrate and the counter substrate. Note that in the above description, active matrix substrates for FFS-mode liquid crystal display devices are described as examples, but active matrix substrates of embodiments of the present invention can be used in liquid crystal display devices of various display modes. Active matrix substrates of embodiments of the present invention can also be used in liquid crystal display devices of lateral electric field modes other than the FFS mode (e.g., the IPS mode) and in liquid crystal display devices of vertical electric field modes (e.g., the TN mode and the vertical alignment mode). Furthermore, the organic EL display device can include an active matrix substrate of an embodiment of the present invention, an organic layer provided on the pixel electrode, and a common electrode provided on the organic layer.

INDUSTRIAL APPLICABILITY

Embodiments of the present invention realize structures suitable for active matrix substrates that are provided with both oxide semiconductor TFTs and crystalline silicon TFTs. Active matrix substrates of embodiments of the present invention are suitable for use in various display devices, such as liquid crystal display devices.

REFERENCE SIGNS LIST

1 Substrate
2 Base coat layer
6 Color filter layer
7 Planarization layer
8 Dielectric layer
9a First light blocking layer 9b Second light blocking layer
10 First TFT
11 Crystalline silicon semiconductor layer
12 First gate electrode
13 First source electrode
14 First drain electrode
20 Second TFT
21 Oxide semiconductor layer
22 Second gate electrode
23 Second source electrode
24 Second drain electrode
30 Pixel electrode
30a Slit
31 Common electrode
41 Driver TFT
42 Selection TFT
43 First current switching TFT
44 Second current switching TFT
45 Capacitor
46 Organic light emitting diode
50 Third TFT
51 Crystalline silicon semiconductor layer
52 Third gate electrode
53 Third source electrode
61 Gate driver circuit
62 Check circuit
63 Source shared driving circuit
64 Driver IC
100, 200, 300, 400 Active matrix substrate
CH1 First contact hole
CH2 Second contact hole
CH3 Third contact hole
CH4 Fourth contact hole
CH5 Fifth contact hole
CHP Pixel contact hole
GI1 First gate insulating layer
GI2 Second gate insulating layer
GI3 Third gate insulating layer
IL1 First insulating layer
IL2 Second insulating layer
IL3 Third insulating layer
IL4 Fourth insulating layer
GL Gate bus line
GL1 First gate bus line
GL2 Second gate bus line
SL Source bus line
CL Current supply line
DR Display region
FR Peripheral region
P Pixel region

The invention claimed is:

1. An active matrix substrate including a display region and a peripheral region, the display region being defined by pixel regions arranged in a matrix, the peripheral region being located around the display region, the active matrix substrate comprising:
a substrate;
a first insulating layer;
a second insulating layer provided above the first insulating layer;
a first Thin Film Transistor (TFT);
a second TFT disposed in the display region; wherein the first TFT includes:
a silicon semiconductor layer including a first channel region, a first source region, and a first drain region;
a first gate insulating layer being provided above the silicon semiconductor layer;
a first gate electrode being provided above the first gate insulating layer, the first gate electrode opposing the first channel region with the first gate insulating layer therebetween; and
a first electrode being electrically connected to one of the first source region and the first drain region;
the second TFT includes:
an oxide semiconductor layer including a second channel region, a second source region, and a second drain region;
a second gate insulating layer being provided above the oxide semiconductor layer;
a second gate electrode being provided above the second gate insulating layer, the second gate electrode opposing the second channel region with the second gate insulating layer therebetween; and
a second electrode being electrically connected to one of the second source region and the second drain region;
the first insulating layer includes the first gate insulating layer;
the second insulating layer includes a portion that covers the first gate electrode and the second gate electrode;
the first electrode and the second electrode are provided above the second insulating layer;
the first electrode is electrically connected to the one of the first source region and the first drain region via a first contact hole defined in the first insulating layer and the second insulating layer; and
the second electrode is electrically connected to the one of the second source region and the second drain region via a second contact hole defined in the second insulating layer.

2. The active matrix substrate according to claim 1, wherein
the first insulating layer includes the second gate insulating layer.

3. The active matrix substrate according to claim 1, wherein
the first gate electrode and the second gate electrode are formed from an identical electrically conductive film.

4. The active matrix substrate according to claim 1, wherein
the first gate insulating layer covers the first source region and the first drain region; and
the second gate insulating layer does not cover at least a part of the second source region and at least a part of the second drain region.

5. The active matrix substrate according to claim 1, further comprising:
the first TFT includes a third electrode:
the second TFT includes a forth electrode: wherein
the third electrode and the forth electrode are provided above the second insulating layer;
the third electrode is electrically connected to another of the first source region and the first drain region via a third contact hole defined in the first insulating layer and the second insulating layer; and
the forth electrode is electrically connected to another of the second source region and the second drain region via a forth contact hole defined in the second insulating layer.

6. The active matrix substrate according to claim 5, wherein
the second electrode does not overlap the second gate electrode as viewed in a direction normal to a surface of the substrate.

7. The active matrix substrate according to claim 6, wherein
the forth electrode does not overlap the second gate electrode as viewed in a direction normal to a surface of the substrate.

8. The active matrix substrate according to claim 1, wherein
the first insulating layer directly contacts to a part of the second insulating layer.

9. The active matrix substrate according to claim 1, wherein
the first TFT is disposed in the display region.

10. The active matrix substrate according to claim 1, wherein
the first TFT is disposed in the peripheral region.

11. The active matrix substrate according to claim 1, further comprising:
a first light blocking layer being provided between the silicon semiconductor layer and the substrate, the first light blocking layer overlapping the silicon semiconductor layer as viewed in a direction normal to a surface of the substrate.

12. The active matrix substrate according to claim 11, wherein
the first light blocking layer is formed of an electrically conductive material.

13. The active matrix substrate according to claim 1, further comprising:
a second light blocking layer being provided between the oxide semiconductor layer and the substrate, the second light blocking layer overlapping the oxide semiconductor layer as viewed in a direction normal to a surface of the substrate.

14. The active matrix substrate according to claim 13, wherein
the second light blocking layer is formed of an electrically conductive material.

15. The active matrix substrate according to claim 14, wherein
the second light blocking layer is electrically connected to the second gate electrode.

16. The active matrix substrate according to claim 1, further comprising:
a base coat layer being provided on the substrate.

17. The active matrix substrate according to claim 16, wherein
the silicon semiconductor layer and the oxide semiconductor layer being provided on the base coat layer.

18. The active matrix substrate according to claim 1, wherein
the oxide semiconductor layer includes at least one metal element selected from In, Ga, and Zn.

19. An organic EL display device comprising the active matrix substrate according to claim 1.

20. The organic EL display device according to claim 19, wherein
the first TFT and the second TFT are disposed in each of the pixel regions.

21. The organic EL display device according to claim 20, wherein
a portion of the silicon semiconductor layer of the first TFT is electrically connected to a portion of the oxide semiconductor layer of the second TFT.

22. The organic EL display device according to claim 21, wherein
the portion of the silicon semiconductor layer of the first TFT is directly connected to the portion of the oxide semiconductor layer of the second TFT.

23. The organic EL display device according to claim 21, wherein:
the first TFT includes a third electrode:
the third electrode is electrically connected to another of the first source region and the first drain region; and
the oxide semiconductor layer of the second TFT is electrically connected to the silicon semiconductor layer via one of the first electrode and the third electrode.

* * * * *